(12) United States Patent
Yang

(10) Patent No.: US 9,365,412 B2
(45) Date of Patent: Jun. 14, 2016

(54) INTEGRATED CMOS AND MEMS DEVICES WITH AIR DIELETRICS

(71) Applicant: MCube, Inc., San Jose, CA (US)

(72) Inventor: Xiao (Charles) Yang, Cupertino, CA (US)

(73) Assignee: mCube Inc., San Jose, CA (US)

(\*) Notice: Subject to any disclaimer, the term of this patent is extended or adjusted under 35 U.S.C. 154(b) by 0 days.

(21) Appl. No.: 13/855,988

(22) Filed: Apr. 3, 2013

(65) Prior Publication Data
US 2016/0060102 A1    Mar. 3, 2016

Related U.S. Application Data

(62) Division of application No. 13/008,870, filed on Jan. 18, 2011, now Pat. No. 8,421,082.

(60) Provisional application No. 61/296,432, filed on Jan. 19, 2010.

(51) Int. Cl.
| | |
|---|---|
| *H01L 27/108* | (2006.01) |
| *B81B 7/00* | (2006.01) |
| *H01L 27/092* | (2006.01) |

(52) U.S. Cl.
CPC .............. *B81B 7/008* (2013.01); *B81B 7/0038* (2013.01); *H01L 27/092* (2013.01); *B81B 2207/094* (2013.01)

(58) Field of Classification Search
CPC ............ H01L 27/0688; H01L 21/8221; H01L 29/0649; H01L 27/11807; B81C 1/00246; B81C 2203/0735; B81C 2203/0714; B81C 2203/0771; B81C 1/00238; B81C 1/00261; B81B 2207/012; B81B 7/007; B81B 7/07

USPC .............. 257/66, 288, 69, 415, 522, E23.145, 257/E21.573, E21.632, 782; 438/50, 422, 438/619, 411, 199, 319, 455, 456
See application file for complete search history.

(56) References Cited

U.S. PATENT DOCUMENTS

| | | |
|---|---|---|
| 3,614,677 A | 10/1971 | Wilfinger |
| 4,954,698 A | 9/1990 | Yasunaga et al. |
| 5,140,745 A | 8/1992 | McKenzie |

(Continued)

OTHER PUBLICATIONS

U.S. Appl. No. 12/913,440, Final Office Action mailed Oct. 10, 2013, 10 pages.
U.S. Appl. No. 12/944,712 Final Office Action mailed Aug. 21, 2013, 15 pages.
U.S. Appl. No. 12/983,309 Notice of Allowance mailed Aug. 13, 2013, 11 pages.

(Continued)

*Primary Examiner* — Howard Weiss
(74) *Attorney, Agent, or Firm* — Kilpatrick Townsend & Stockton LLP

(57) ABSTRACT

A monolithically integrated CMOS and MEMS device. The device includes a first semiconductor substrate having a first surface region and one or more CMOS IC devices on a CMOS IC device region overlying the first surface region. The CMOS IC device region can also have a CMOS surface region. A bonding material can be provided overlying the CMOS surface region to form an interface by which a second semiconductor substrate can be joined to the CMOS surface region. The second semiconductor substrate has a second surface region coupled to the CMOS surface region by bonding the second surface region to the bonding material. The second semiconductor substrate includes one or more first air dielectric regions. One or more free standing MEMS structures can be formed within one or more portions of the processed first substrate.

20 Claims, 21 Drawing Sheets

(56) References Cited

U.S. PATENT DOCUMENTS

| | | |
|---|---|---|
| 5,157,841 A | 10/1992 | Dinsmore |
| 5,173,597 A | 12/1992 | Anglin |
| 5,488,765 A | 2/1996 | Kubota et al. |
| 5,493,769 A | 2/1996 | Sakai et al. |
| 5,610,414 A | 3/1997 | Yoneda et al. |
| 5,668,033 A | 9/1997 | Ohara |
| 5,729,074 A | 3/1998 | Shiomi et al. |
| 6,046,409 A | 4/2000 | Ishii et al. |
| 6,076,731 A | 6/2000 | Terrell |
| 6,115,261 A | 9/2000 | Platt et al. |
| 6,188,322 B1 | 2/2001 | Yao |
| 6,263,736 B1 | 7/2001 | Thunder et al. |
| 6,278,178 B1 | 8/2001 | Kwon et al. |
| 6,480,699 B1 | 11/2002 | Lovoi |
| 6,483,172 B1 | 11/2002 | Cote |
| 6,485,273 B1 | 11/2002 | Goodwin-Johansson |
| 6,534,726 B1 | 3/2003 | Okada et al. |
| 6,576,999 B2 | 6/2003 | Sakai et al. |
| 6,656,604 B2 | 12/2003 | Hasewaga |
| 6,753,664 B2 | 6/2004 | Neufeld et al. |
| 6,855,572 B2 | 2/2005 | Jeun et al. |
| 6,912,336 B2 | 6/2005 | Ishii |
| 6,933,165 B2 | 8/2005 | Musolf et al. |
| 6,953,983 B2 * | 10/2005 | Farrar .................. 257/522 |
| 6,979,872 B2 * | 12/2005 | Borwick et al. ........... 257/415 |
| 7,019,434 B2 | 3/2006 | Helmbrecht |
| 7,095,226 B2 | 8/2006 | Wan et al. |
| 7,145,555 B2 | 12/2006 | Taylor et al. |
| 7,183,630 B1 | 2/2007 | Fogelson et al. |
| 7,193,312 B2 | 3/2007 | Boon et al. |
| 7,195,945 B1 | 3/2007 | Edelstein et al. |
| 7,239,000 B2 | 7/2007 | Witcraft |
| 7,248,131 B2 * | 7/2007 | Fazzio et al. ............ 333/187 |
| 7,253,079 B2 | 8/2007 | Hanson et al. |
| 7,258,009 B2 | 8/2007 | Imai |
| 7,358,724 B2 | 4/2008 | Taylor et al. |
| 7,370,530 B2 | 5/2008 | DCamp et al. |
| 7,391,091 B2 | 6/2008 | Tondra |
| 7,402,449 B2 | 7/2008 | Fukuda et al. |
| 7,430,674 B2 | 9/2008 | Van Mueller et al. |
| 7,453,269 B2 | 11/2008 | Won et al. |
| 7,454,705 B2 | 11/2008 | Cadez et al. |
| 7,456,042 B2 | 11/2008 | Stark |
| 7,493,496 B2 | 2/2009 | Smith et al. |
| 7,498,715 B2 | 3/2009 | Yang |
| 7,511,379 B1 | 3/2009 | Flint |
| 7,514,760 B1 | 4/2009 | Quevy |
| 7,521,783 B2 | 4/2009 | Tsai et al. |
| 7,536,909 B2 | 5/2009 | Zhao et al. |
| 7,585,750 B2 | 9/2009 | Do et al. |
| 7,612,443 B1 | 11/2009 | Bernstein et al. |
| 7,671,478 B2 | 3/2010 | Wathanawasam et al. |
| 7,676,340 B2 | 3/2010 | Yasui |
| 7,690,255 B2 | 4/2010 | Gogoi et al. |
| 7,708,189 B1 | 5/2010 | Cipriano |
| 7,713,785 B1 | 5/2010 | Flint |
| 7,779,689 B2 | 8/2010 | Li et al. |
| 7,814,791 B2 | 10/2010 | Andersson et al. |
| 7,814,792 B2 | 10/2010 | Tateyama et al. |
| 7,814,793 B2 | 10/2010 | Sato |
| 7,861,422 B2 | 1/2011 | MacDonald |
| 7,891,103 B2 | 2/2011 | Mayor |
| 8,011,577 B2 | 9/2011 | Mullen et al. |
| 8,016,191 B2 | 9/2011 | Bonalle et al. |
| 8,037,758 B2 | 10/2011 | Sato |
| 8,056,412 B2 | 11/2011 | Rutkiewicz et al. |
| 8,061,049 B2 | 11/2011 | Mayor |
| 8,070,055 B2 | 12/2011 | Block et al. |
| 8,087,296 B2 | 1/2012 | Ueda et al. |
| 8,140,358 B1 | 3/2012 | Ling et al. |
| 8,148,808 B2 | 4/2012 | Braden et al. |
| 8,165,323 B2 | 4/2012 | Zhou |
| 8,181,874 B1 | 5/2012 | Wan et al. |
| 8,227,285 B1 | 7/2012 | Yang |
| 8,236,577 B1 | 8/2012 | Hsu |
| 8,245,923 B1 | 8/2012 | Merrill et al. |
| 8,250,921 B2 | 8/2012 | Nasiri et al. |
| 8,259,311 B2 | 9/2012 | Petschko |
| 8,324,047 B1 | 12/2012 | Yang |
| 8,342,021 B2 | 1/2013 | Oshio |
| 8,367,522 B1 | 2/2013 | Yang |
| 8,395,252 B1 * | 3/2013 | Yang ............................ 257/687 |
| 8,395,381 B2 | 3/2013 | Lo |
| 8,402,666 B1 | 3/2013 | Hsu et al. |
| 8,407,905 B1 | 4/2013 | Hsu et al. |
| 8,421,082 B1 | 4/2013 | Yang |
| 8,450,779 B2 * | 5/2013 | Guo et al. ........... H01L 27/0688 257/211 |
| 8,476,084 B1 | 7/2013 | Yang et al. |
| 8,476,129 B1 | 7/2013 | Jensen et al. |
| 8,477,473 B1 | 7/2013 | Koury et al. |
| 8,486,723 B1 | 7/2013 | Wan et al. |
| 2001/0053565 A1 | 12/2001 | Khoury |
| 2002/0072163 A1 | 6/2002 | Wong et al. |
| 2002/0134837 A1 | 9/2002 | Kishon |
| 2003/0058069 A1 | 3/2003 | Schwartz et al. |
| 2003/0095115 A1 | 5/2003 | Brian et al. |
| 2003/0184189 A1 | 10/2003 | Sinclair |
| 2003/0230802 A1 | 12/2003 | Poo et al. |
| 2004/0002808 A1 | 1/2004 | Hashimoto et al. |
| 2004/0016995 A1 | 1/2004 | Kuo et al. |
| 2004/0017644 A1 | 1/2004 | Goodwin-Johansson |
| 2004/0056742 A1 | 3/2004 | Dabbaj |
| 2004/0063325 A1 | 4/2004 | Urano et al. |
| 2004/0104268 A1 | 6/2004 | Bailey |
| 2004/0113246 A1 | 6/2004 | Boon |
| 2004/0119836 A1 | 6/2004 | Kitaguchi et al. |
| 2004/0140962 A1 | 7/2004 | Wang et al. |
| 2004/0177045 A1 | 9/2004 | Brown |
| 2004/0207035 A1 | 10/2004 | Witcraft et al. |
| 2004/0227201 A1 | 11/2004 | Borwick, III et al. |
| 2005/0074147 A1 | 4/2005 | Smith et al. |
| 2005/0090038 A1 | 4/2005 | Wallace |
| 2005/0174338 A1 | 8/2005 | Ing |
| 2005/0247787 A1 | 11/2005 | Von Mueller et al. |
| 2006/0049826 A1 | 3/2006 | Daneman et al. |
| 2006/0081954 A1 | 4/2006 | Tondra et al. |
| 2006/0141786 A1 | 6/2006 | Boezen et al. |
| 2006/0168832 A1 | 8/2006 | Yasui et al. |
| 2006/0192465 A1 | 8/2006 | Kornbluh et al. |
| 2006/0208326 A1 | 9/2006 | Nasiri et al. |
| 2006/0211044 A1 | 9/2006 | Green |
| 2006/0238621 A1 | 10/2006 | Okubo et al. |
| 2006/0243049 A1 | 11/2006 | Ohta et al. |
| 2006/0274399 A1 | 12/2006 | Yang |
| 2007/0132733 A1 | 6/2007 | Ram |
| 2007/0152976 A1 | 7/2007 | Townsend et al. |
| 2007/0181962 A1 | 8/2007 | Partridge et al. |
| 2007/0200564 A1 | 8/2007 | Motz et al. |
| 2007/0281379 A1 | 12/2007 | Stark et al. |
| 2008/0014682 A1 | 1/2008 | Yang et al. |
| 2008/0066547 A1 | 3/2008 | Tanaka et al. |
| 2008/0110259 A1 | 5/2008 | Takeno |
| 2008/0119000 A1 | 5/2008 | Yeh et al. |
| 2008/0123242 A1 | 5/2008 | Zhou |
| 2008/0210007 A1 | 9/2008 | Yamaji et al. |
| 2008/0211043 A1 | 9/2008 | Chen |
| 2008/0211113 A1 | 9/2008 | Chua et al. |
| 2008/0277747 A1 | 11/2008 | Ahmad |
| 2008/0283991 A1 | 11/2008 | Reinert |
| 2009/0007661 A1 | 1/2009 | Nasiri et al. |
| 2009/0049911 A1 | 2/2009 | Fukuda et al. |
| 2009/0108440 A1 | 4/2009 | Meyer et al. |
| 2009/0115412 A1 | 5/2009 | Fuse |
| 2009/0153500 A1 | 6/2009 | Cho et al. |
| 2009/0262074 A1 | 10/2009 | Nasiri et al. |
| 2009/0267906 A1 | 10/2009 | Schroderus |
| 2009/0307557 A1 | 12/2009 | Rao et al. |
| 2009/0321510 A1 | 12/2009 | Day et al. |
| 2010/0044121 A1 | 2/2010 | Simon et al. |
| 2010/0045282 A1 | 2/2010 | Shibasaki et al. |
| 2010/0071467 A1 | 3/2010 | Nasiri et al. |
| 2010/0075481 A1 | 3/2010 | Yang |
| 2010/0083756 A1 | 4/2010 | Merz et al. |

(56) References Cited

U.S. PATENT DOCUMENTS

| | | |
|---|---|---|
| 2010/0095769 A1 | 4/2010 | Matsumoto et al. |
| 2010/0109102 A1 | 5/2010 | Chen et al. |
| 2010/0171570 A1 | 7/2010 | Chandrahalim |
| 2010/0208118 A1 | 8/2010 | Ueyama |
| 2010/0236327 A1 | 9/2010 | Mao |
| 2010/0248662 A1 | 9/2010 | Sheynblat et al. |
| 2010/0260388 A1 | 10/2010 | Garret et al. |
| 2010/0302199 A1 | 12/2010 | Taylor et al. |
| 2010/0306117 A1 | 12/2010 | Terayoko |
| 2010/0307016 A1 | 12/2010 | Mayor et al. |
| 2010/0312519 A1 | 12/2010 | Huang et al. |
| 2011/0131825 A1 | 6/2011 | Mayor et al. |
| 2011/0146401 A1 | 6/2011 | Inaguma et al. |
| 2011/0154905 A1 | 6/2011 | Hsu |
| 2011/0172918 A1 | 7/2011 | Tome |
| 2011/0183456 A1 | 7/2011 | Hsieh et al. |
| 2011/0198395 A1 | 8/2011 | Chen |
| 2011/0265574 A1 | 11/2011 | Yang |
| 2011/0266340 A9 | 11/2011 | Block et al. |
| 2011/0312349 A1 | 12/2011 | Forutanpour et al. |
| 2012/0007597 A1 | 1/2012 | Seeger et al. |
| 2012/0007598 A1 | 1/2012 | Lo et al. |
| 2012/0215475 A1 | 8/2012 | Rutledge et al. |

OTHER PUBLICATIONS

U.S. Appl. No. 13/924,457 Notice of Allowance mailed Sep. 18, 2013, 11 pages.

U.S. Appl. No. 13/035,968 Non-Final Office Action mailed Jul. 31, 2013, 8 pages.

U.S. Appl. No. 13/035,969 Non-Final Office Action mailed Oct. 25, 2013, 11 pages.

U.S. Appl. No. 13/751,014 Notice of Allowance mailed Jul. 31, 2013, 9 pages.

U.S. Appl. No. 12/787,368 Non-Final Office Action mailed Sep. 19, 2013, 19 pages.

U.S. Appl. No. 13/922,983 Notice of Allowance mailed Oct. 7, 2013, 10 pages.

U.S. Appl. No. 12/787,200 Notice of Allowance mailed Sep. 26, 2013, 11 pages.

U.S. Appl. No. 13/177,053 Non-Final Office Action mailed Sep. 18, 2013, 12 pages.

U.S. Appl. No. 13/164,311 Notice of Allowance mailed Sep. 17, 2013, 8 pages.

U.S. Appl. No. 13/163,672 Non-Final Office Action mailed Sep. 5, 2013, 7 pages.

U.S. Appl. No. 12/940,025 Notice of Allowance mailed Oct. 17, 2013, 10 pages.

* cited by examiner

INTEGRATED CMOS AND MEMS DEVICES WITH AIR DIELETRICS

CROSS-REFERENCES TO RELATED APPLICATIONS

The present application is a divisional application of and incorporates by reference, for all purposes, the following patent application: U.S. patent application Ser. No. 13/008,870, filed Jan. 18, 2011, now U.S. Pat. No. 8,421,082. The present invention also incorporates by reference, for all purposes, the following co-pending patent applications: U.S. patent application Ser. No. 12/490,067, filed Jun. 23, 2009, U.S. patent application Ser. No. 12/717,070, filed Mar. 3, 2010, U.S. patent application Ser. No. 12/945,087, filed Nov. 12, 2010, and U.S. patent application Ser. No. 12/945,834, filed Nov. 13, 2010.

BACKGROUND OF THE INVENTION

Embodiments of the present invention relate generally to integrated devices. More particularly, embodiments of the present invention provide a method for fabricating an integrated CMOS and MEMS device using an air dielectric. More specifically, embodiments of the present invention provide a method for bonding one or more semiconductor materials to form one or more air dielectric regions within an integrated CMOS and MEMS device. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that embodiments of the invention have a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

According to the present invention, techniques related generally to integrated devices and systems are provided. More particularly, embodiments of the present invention provide a method for fabricating an integrated CMOS and MEMS device using an air dielectric. More specifically, embodiments of the present invention provide a method for patterning one or more semiconductor layers to form one or more air dielectric regions within an integrated CMOS and MEMS device. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

A specific embodiment of the present invention provides a method for fabricating a monolithic integrated CMOS and MEMS device. The method includes providing a first semiconductor substrate having a first surface region and forming one or more CMOS IC devices on a CMOS IC device region overlying the first surface region. The CMOS IC device region can also have a CMOS surface region. A bonding material can be formed overlying the CMOS surface region to form an interface by which a second semiconductor substrate can be joined to the CMOS surface region. The second semiconductor substrate having a second surface region to the CMOS surface region by bonding the second surface region to the bonding material, the second semiconductor substrate comprising one or more first air dielectric regions. One or more free standing MEMS structures can be formed within one or more portions of the processed first substrate.

Embodiments of the present invention can provide many benefits over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. In a specific embodiment, the air dielectric regions can reduce metal line coupling, capacitance, signal interference, and other related issues. Also, these regions can reduce parasitic coupling to the substrate, reduce signal loss, and reduce power while increasing bandwidth. These benefits, as well as others, can be used to achieve higher performance (i.e. less reflection and lower power) in antennas and lower loss and higher isolation in transmission lines. Embodiments of the invention provide for an improved MEMS device system and related applications for a variety of uses. One or more embodiments of the present invention provide for one or more MEMS and related applications, which may be integrated on one or more CMOS device structures. Depending upon the embodiment, one or more of these benefits may be achieved. These and other benefits will be described in more throughout the present specification and more particularly below.

Various additional embodiments, features, and advantages of the present invention can be more fully appreciated with reference to the detailed description and accompanying drawings that follow.

DETAILED DESCRIPTION OF THE INVENTION

According to the present invention, techniques related generally to integrated devices and systems are provided. More particularly, the present invention provides a method for fabricating an integrated CMOS and MEMS device using an air dielectric. More specifically, the present invention provides a method for bonding semiconductor materials to form one or more air dielectric regions within an integrated CMOS and MEMS device. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Figure 1A:
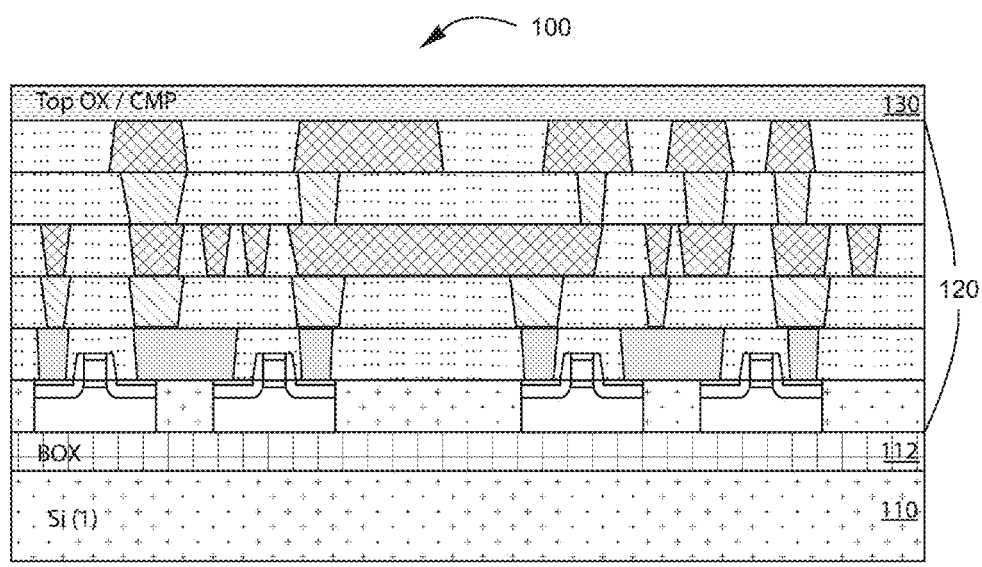
FIG. 1A is a simplified cross-section diagram of an integrated CMOS and MEMS device according to an embodiment of the present invention.
Figure 1B:
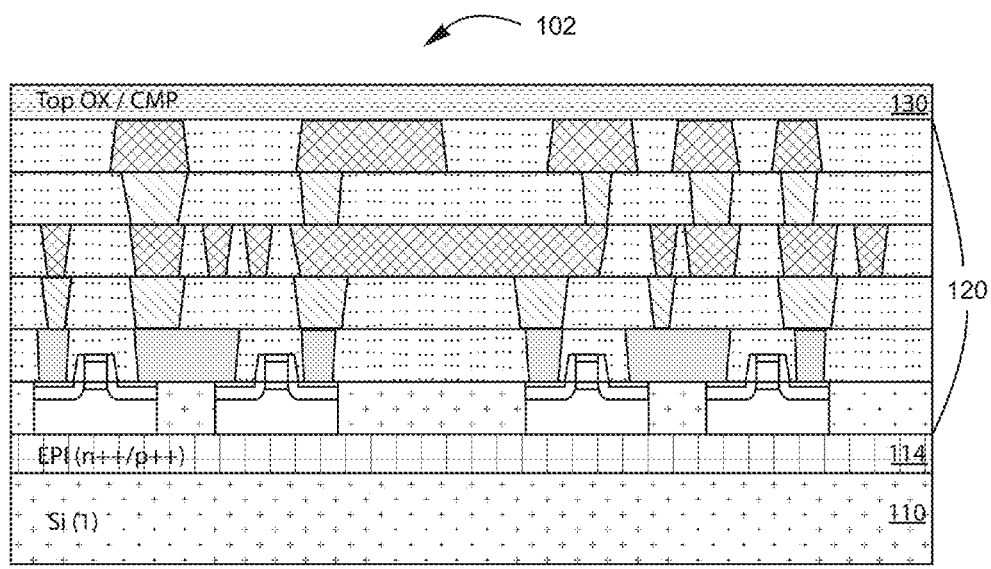
FIG. 1B is a simplified cross-section diagram of an integrated CMOS and MEMS device according to an embodiment of the present invention.
Figure 1C:
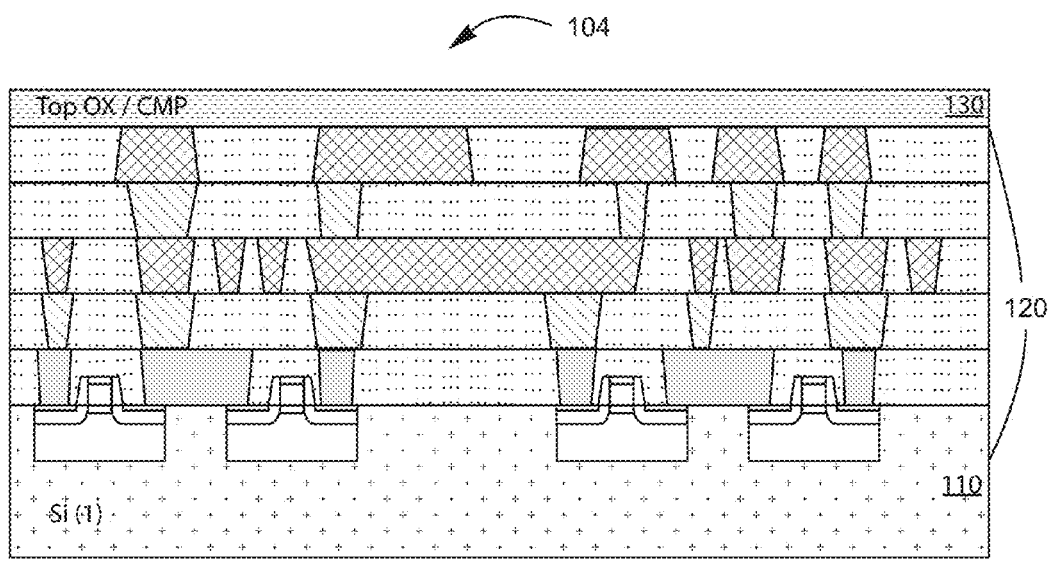
FIG. 1C is a simplified cross-section diagram of an integrated CMOS and MEMS device according to an embodiment of the present invention.

FIGS. 1A-1C are simplified cross-section diagrams of an integrated CMOS and MEMS device according to an embodiment of the present invention. These diagrams are merely an example, which should not unduly limit the scope of the claims herein. One of ordinary skill in the art would recognize other variations, modifications, and alternatives. As shown, each of devices 100, 102, and 104 includes a thickness of silicon material 110, one or more CMOS integrated circuit (IC) devices 120, and a dielectric layer 130. Components shown in these figures can represent an initial phase for a method of fabricating an integrated CMOS and MEMS device using air dielectrics. Those of ordinary skill in the art will recognize other variations, modifications, and alternatives.

In an embodiment, a layer of material can be spatially disposed overlying a thickness of silicon material 110 to form a first semiconductor substrate. In a specific embodiment, the layer of material disposed overlying thickness of silicon material 110 can be a buried oxide (BOX) layer 112, as shown in device 100 of FIG. 1A. In another specific embodiment, the layer of material disposed overlying thickness of silicon material 110 can be an epitaxial (EPI) layer 114, as shown in device 102 of FIG. 1B. In yet another specific embodiment, the first semiconductor substrate can have just thickness of silicon material 110, as shown in device 104 of FIG. 1C. In further embodiments, the first semiconductor substrate can have a silicon, single crystal silicon, or polycrystalline silicon material. Those skilled in the art will recognize other variations, modifications, and alternatives.

In an embodiment, the first semiconductor substrate can have a first surface region and the CMOS device region can be a region overlying the first surface region. One or more CMOS IC devices 120 can be spatially disposed on the CMOS IC device region overlying the first surface region. The CMOS IC device region can have a CMOS surface region. In a specific embodiment, one or more CMOS IC devices 120 can include transistor devices, metal layers, via structures, and others. In further embodiments, additional transistors, metal layers, and structures can be added. The fabrication of one or more CMOS IC device 120 can be done through foundry-compatible processes. Of course, there can be other variations, modifications, and alternatives.

In an embodiment, dielectric layer 130 can be spatially disposed overlying the CMOS surface region. Dielectric layer 130 can have one or more patterned regions. In a specific embodiment, dielectric layer 130 can be a top oxide layer or formed via a chemical mechanical planarization (CMP) process. As stated previously, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 2A:
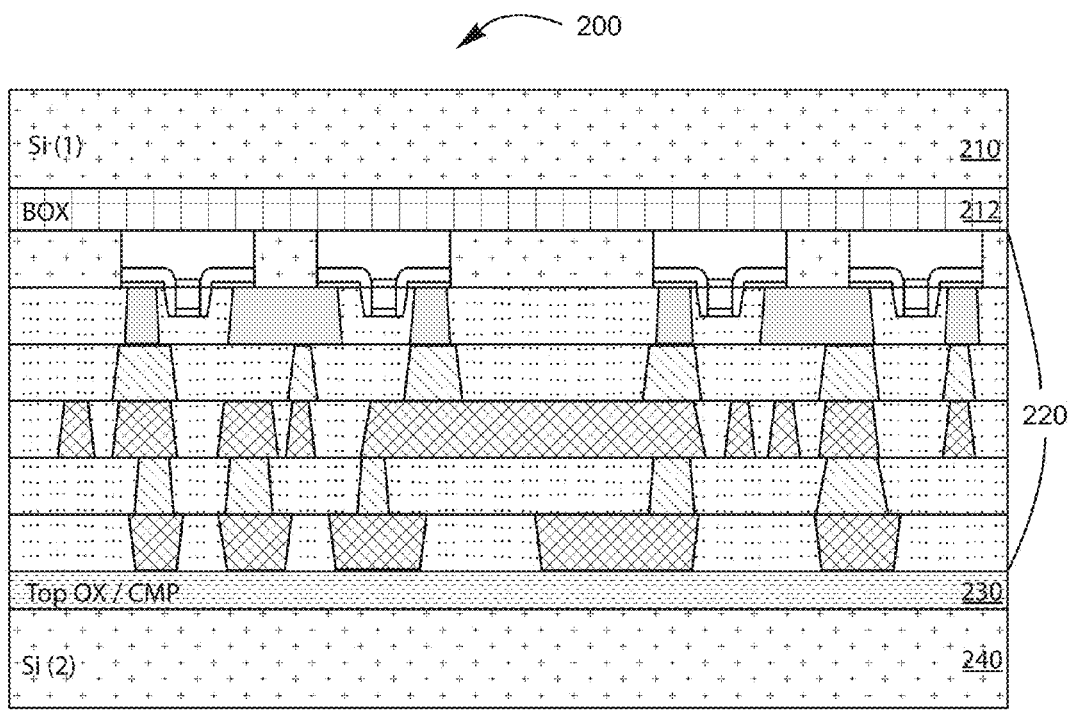
FIG. 2A is a simplified cross-section diagram of an integrated CMOS and MEMS device according to an embodiment of the present invention.
Figure 2B:
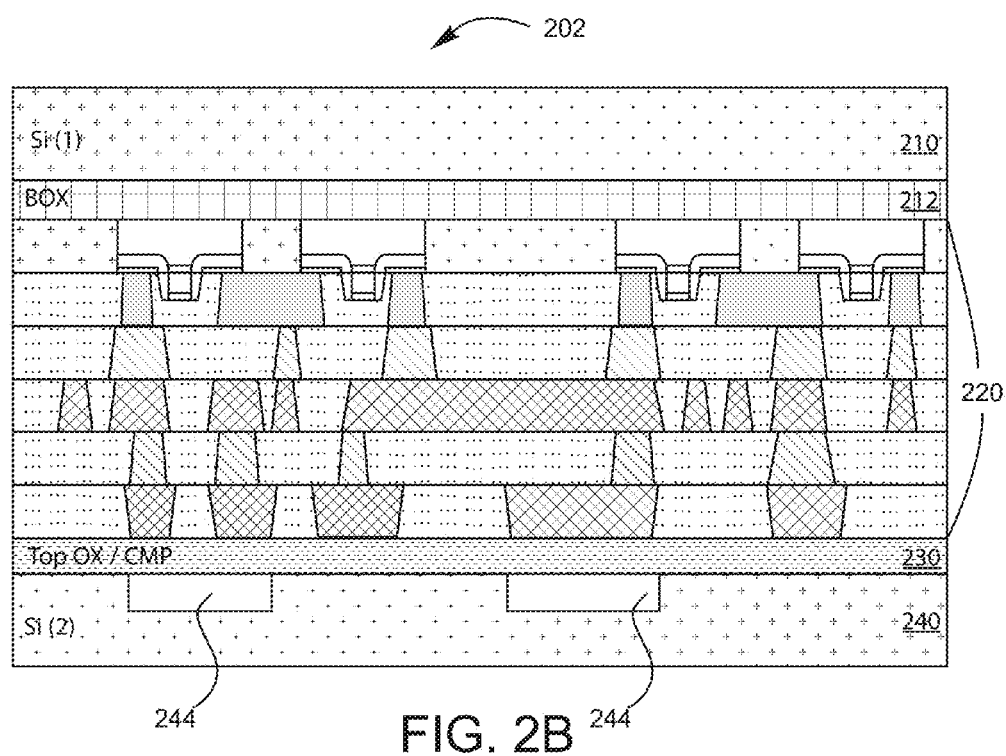
FIG. 2B is a simplified cross-section diagram of an integrated CMOS and MEMS device according to an embodiment of the present invention.

FIGS. 2A and 2B are simplified cross-section diagrams of an integrated CMOS and MEMS device according to an embodiment of the present invention. This diagram is merely an example, which should not unduly limit the scope of the claims herein. One of ordinary skill in the art would recognize other variations, modifications, and alternatives. As shown, each of devices 200 and 202 includes a thickness of silicon material 210, one or more CMOS integrated circuit (IC) devices 220, and a dielectric layer 230, and a second semiconductor substrate 240. Components shown in these figures can represent a step in a method of fabricating an integrated CMOS and MEMS device using air dielectrics. Those of ordinary skill in the art will recognize other variations, modifications, and alternatives.

In an embodiment, a layer of material can be spatially disposed overlying thickness of silicon material 210 to form a first semiconductor substrate. In a specific embodiment, the layer of material disposed overlying thickness of silicon material 210 can be a buried oxide (BOX) layer 212, as shown in device 200 of FIG. 2A. In another specific embodiment, the layer of material disposed overlying thickness of silicon material 210 can be an epitaxial (EPI) layer or the first semiconductor substrate can have just thickness of silicon material 210. In further embodiments, the first and second semiconductor substrate can have a silicon, single crystal silicon, or polycrystalline silicon material. Those skilled in the art will recognize other variations, modifications, and alternatives.

In an embodiment, the first semiconductor substrate can have a first surface region and the CMOS device region can be a region overlying the first surface region. One or more CMOS IC devices 220 can be spatially disposed on the CMOS IC device region overlying the first surface region. The CMOS IC device region can have a CMOS surface region. In a specific embodiment, one or more CMOS IC devices 220 can include transistor devices, metal layers, via structures, and others. In further embodiments, additional transistors, metal layers, and structures can be added. The fabrication of one or more CMOS IC device 220 can be done through foundry-compatible processes. Of course, there can be other variations, modifications, and alternatives.

In an embodiment, dielectric layer 230 can be spatially disposed overlying the CMOS surface region. Dielectric layer 230 can have one or more patterned regions. In a specific embodiment, dielectric layer 230 can be a top oxide layer or formed via a chemical mechanical planarization (CMP) process. As stated previously, there can be other variations, modifications, and alternatives.

In an embodiment, second semiconductor substrate 240 can be joined to the CMOS surface region by bonding the second surface region to dielectric layer 230, as shown in device 200 of FIG. 2A. The second semiconductor substrate can have a second surface region. Also, the second semiconductor substrate can be patterned such that one or more portions of the second substrate within a vicinity of one or more CMOS IC devices 220 are removed in order to form one or more first air dielectric regions 244, as shown in device 202 of FIG. 2B. In a specific embodiment, the second substrate can be patterned before bonding. Air dielectric regions 244 can reduce metal line coupling, capacitance, signal interference, and other related issues. In a specific embodiment, regions 244 can also reduce parasitic coupling to the substrate, reduce signal loss, and reduce power while increasing bandwidth. These benefits, as well as others, can be used to achieve higher performance (i.e. less reflection and lower power) in antennas and lower loss and higher isolation in transmission lines. Again, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 3:
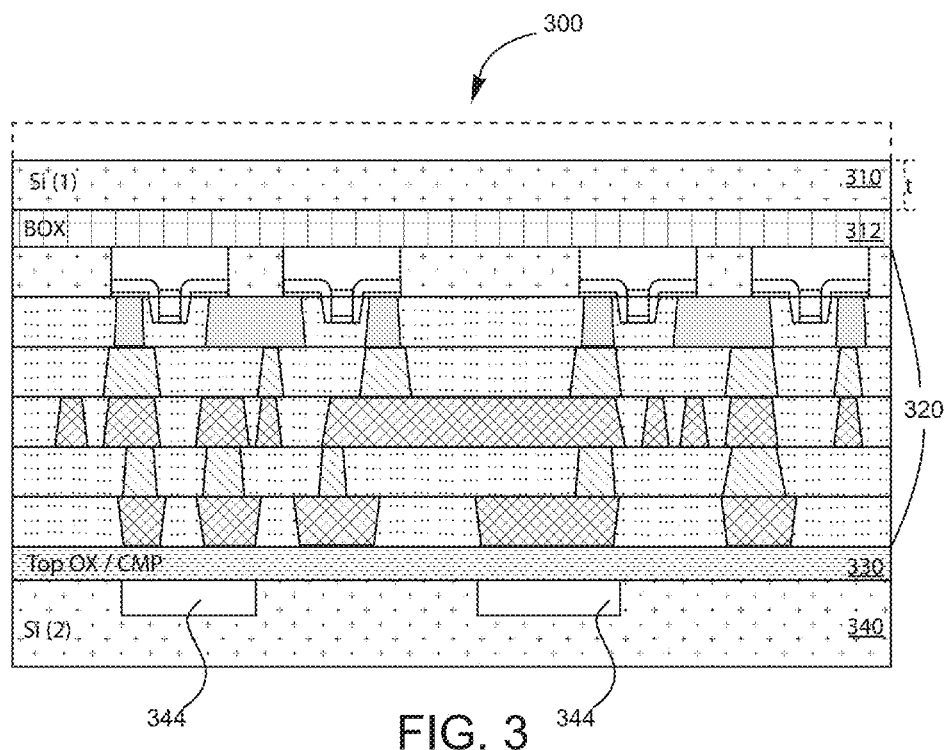
FIG. 3 is a simplified cross-section diagram of an integrated CMOS and MEMS device according to an embodiment of the present invention.

FIG. 3 is a simplified cross-section diagram of an integrated CMOS and MEMS device according to an embodiment of the present invention. This diagram is merely an example, which should not unduly limit the scope of the claims herein. One of ordinary skill in the art would recognize other variations, modifications, and alternatives. As shown, device 300 includes a thickness of silicon material 310, one or more CMOS integrated circuit (IC) devices 320, and a dielectric layer 330, and a second semiconductor substrate 340. Components shown in these figures can represent a step in a method of fabricating an integrated CMOS and MEMS device using air dielectrics. Those of ordinary skill in the art will recognize other variations, modifications, and alternatives.

In an embodiment, a layer of material can be spatially disposed overlying thickness of silicon material 310 to form a first semiconductor substrate. In a specific embodiment, the layer of material disposed overlying thickness of silicon material 310 can be a buried oxide (BOX) layer 312. In another specific embodiment, the layer of material disposed overlying thickness of silicon material 310 can be an epitaxial (EPI) layer or the first semiconductor substrate can have just thickness of silicon material 310. In further embodiments, the first and second semiconductor substrate can have a silicon, single crystal silicon, or polycrystalline silicon material. Those skilled in the art will recognize other variations, modifications, and alternatives.

In an embodiment, the first semiconductor substrate can have a first surface region and the CMOS device region can be a region overlying the first surface region. One or more CMOS IC devices 320 can be spatially disposed on the CMOS IC device region overlying the first surface region. The CMOS IC device region can have a CMOS surface region. In a specific embodiment, one or more CMOS IC devices 320 can include transistor devices, metal layers, via structures, and others. In further embodiments, additional transistors, metal layers, and structures can be added. The fabrication of one or more CMOS IC device 320 can be done through foundry-compatible processes. Of course, there can be other variations, modifications, and alternatives.

In an embodiment, dielectric layer 330 can be spatially disposed overlying the CMOS surface region. Dielectric layer 330 can have one or more patterned regions. In a specific embodiment, dielectric layer 330 can be a top oxide layer or formed via a chemical mechanical planarization (CMP) process. As stated previously, there can be other variations, modifications, and alternatives.

In an embodiment, second semiconductor substrate 340 can be joined to the CMOS surface region by bonding the second surface region to dielectric layer 330. The second semiconductor substrate can have a second surface region. Also, the second semiconductor substrate can be patterned such that one or more portions of the second substrate within a vicinity of one or more CMOS IC devices 320 are removed in order to form one or more first air dielectric regions 344. In a specific embodiment, the second substrate can be patterned before bonding. Air dielectric regions 344 can reduce metal line coupling, capacitance, signal interference, and other related issues. In a specific embodiment, regions 344 can also reduce parasitic coupling to the substrate, reduce signal loss, and reduce power while increasing bandwidth. These benefits, as well as others, can be used to achieve higher performance (i.e. less reflection and lower power) in antennas and lower loss and higher isolation in transmission lines. Again, there can be other variations, modifications, and alternatives.

In an embodiment, the first substrate can be thinned to a desired thickness while maintaining attachment to the CMOS IC device region. In a specific embodiment, the thinning can include a grinding process to remove a thickness of material from the first semiconductor substrate to expose a ground surface region. This process can be done by removing a portion of thickness of silicon material 310 without removing any portion the BOX layer. In other embodiments, this process can be done by removing a portion of thickness of silicon material 310 without removing any portion of the EPI layer or without removing material from the CMOS IC device region. Again, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 4A:
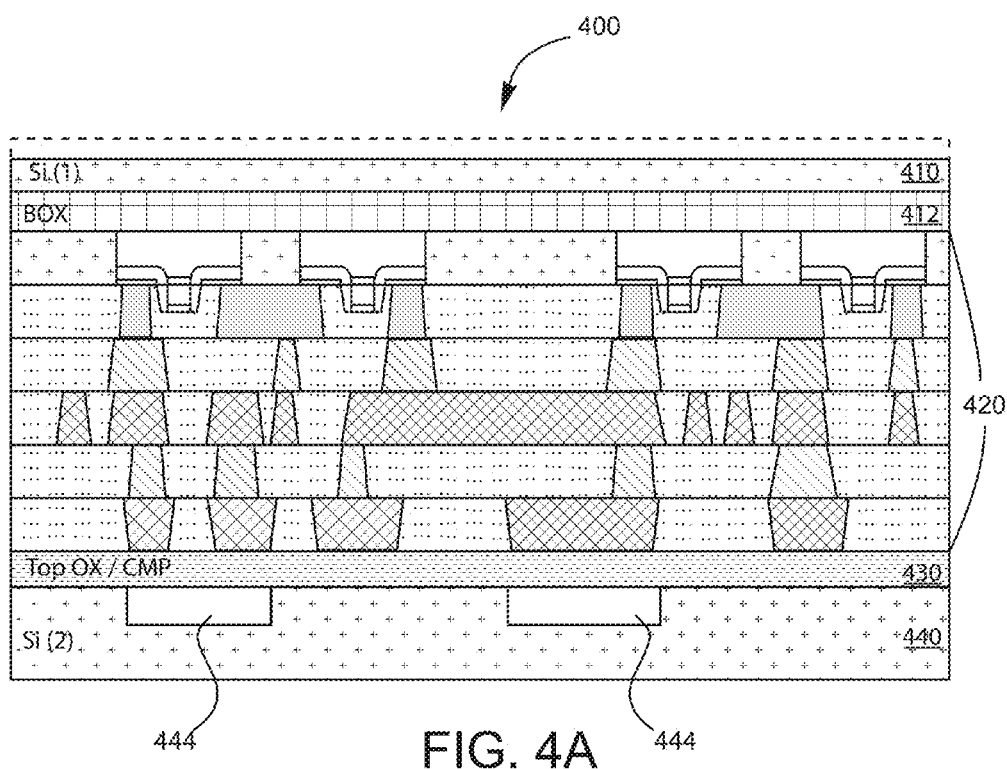
FIG. 4A is a simplified cross-section diagram of an integrated CMOS and MEMS device according to an embodiment of the present invention.
Figure 4B:
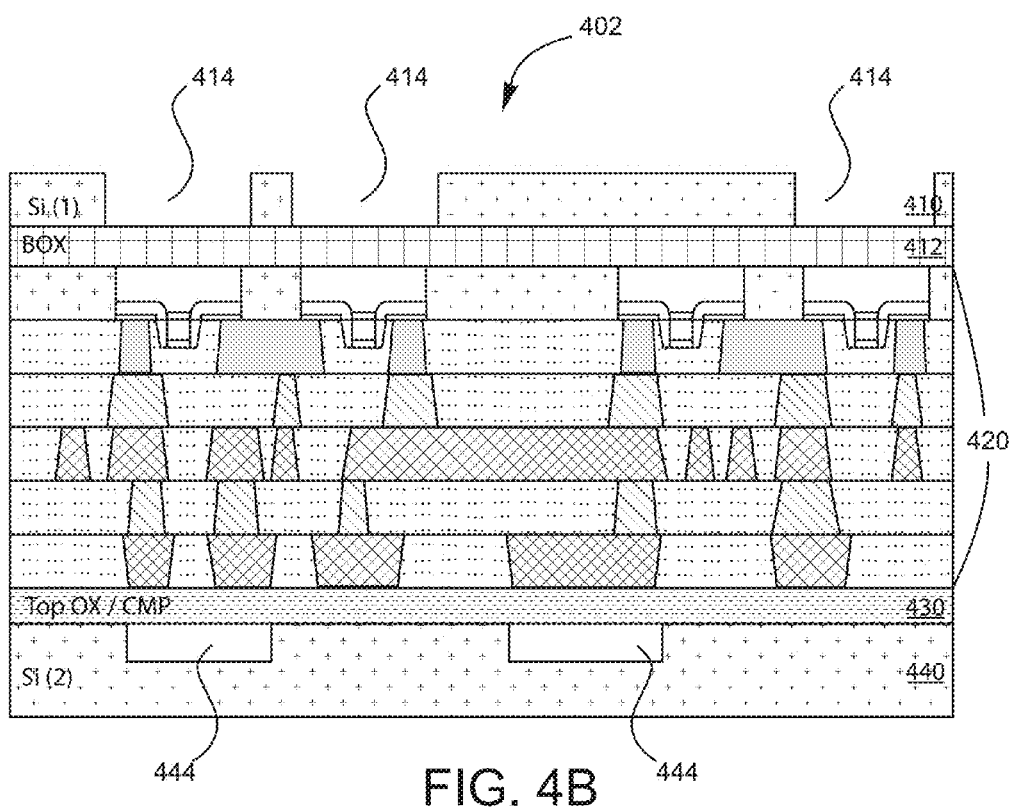
FIG. 4B is a simplified cross-section diagram of an integrated CMOS and MEMS device according to an embodiment of the present invention.
Figure 4C:
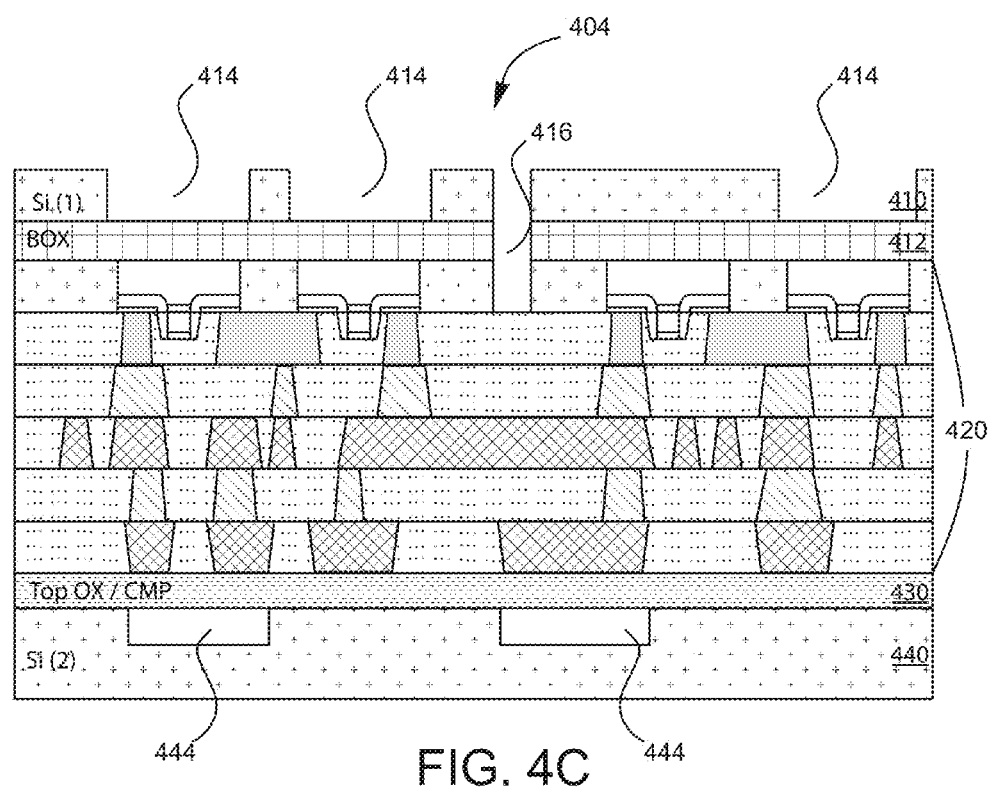
FIG. 4C is a simplified cross-section diagram of an integrated CMOS and MEMS device according to an embodiment of the present invention.

FIGS. 4A-4C are simplified cross-section diagrams of an integrated CMOS and MEMS device according to an embodiment of the present invention. This diagram is merely an example, which should not unduly limit the scope of the claims herein. One of ordinary skill in the art would recognize other variations, modifications, and alternatives. As shown, each of devices 400, 402, and 404 includes a thickness of silicon material 410, one or more CMOS integrated circuit (IC) devices 420, and a dielectric layer 430, and a second semiconductor substrate 440. Components shown in these figures can represent a step in a method of fabricating an integrated CMOS and MEMS device using air dielectrics. Those of ordinary skill in the art will recognize other variations, modifications, and alternatives.

In an embodiment, a layer of material can be spatially disposed overlying thickness of silicon material 410 to form a first semiconductor substrate. In a specific embodiment, the layer of material disposed overlying the thickness of silicon material 410 can be a buried oxide (BOX) layer 412. In another specific embodiment, the layer of material disposed overlying thickness of silicon material 410 can be an epitaxial (EPI) layer or the first semiconductor substrate can have just thickness of silicon material 410. In further embodiments, the first and second semiconductor substrate can have a silicon, single crystal silicon, or polycrystalline silicon material. Those skilled in the art will recognize other variations, modifications, and alternatives.

In an embodiment, the first semiconductor substrate can have a first surface region and the CMOS device region can be a region overlying the first surface region. One or more CMOS IC devices 420 can be spatially disposed on the CMOS IC device region overlying the first surface region. The CMOS IC device region can have a CMOS surface region. In a specific embodiment, one or more CMOS IC devices 420 can include transistor devices, metal layers, via structures, and others. In further embodiments, additional transistors, metal layers, and structures can be added. The fabrication of one or more CMOS IC device 420 can be done through foundry-compatible processes. Of course, there can be other variations, modifications, and alternatives.

In an embodiment, dielectric layer 430 can be spatially disposed overlying the CMOS surface region. Dielectric layer 430 can have one or more patterned regions. In a specific embodiment, dielectric layer 430 can be a top oxide layer or formed via a chemical mechanical planarization (CMP) process. As stated previously, there can be other variations, modifications, and alternatives.

In an embodiment, second semiconductor substrate 440 can be joined to the CMOS surface region by bonding the second surface region to dielectric layer 430. The second semiconductor substrate can have a second surface region. Also, the second semiconductor substrate can be patterned such that one or more portions of the second substrate within a vicinity of one or more CMOS IC devices 420 are removed in order to form one or more first air dielectric regions 444. In a specific embodiment, the second substrate can be patterned before bonding. Air dielectric regions 444 can reduce metal line coupling, capacitance, signal interference, and other related issues. In a specific embodiment, regions 444 can also reduce parasitic coupling to the substrate, reduce signal loss, and reduce power while increasing bandwidth. These benefits, as well as others, can be used to achieve higher performance (i.e. less reflection and lower power) in antennas and lower loss and higher isolation in transmission lines. Again, there can be other variations, modifications, and alternatives.

In an embodiment, the first substrate can be thinned to a desired thickness while maintaining attachment to the CMOS IC device region. In a specific embodiment, the thinning can include a grinding process to remove a thickness of material from the first semiconductor substrate to expose a ground surface region. This process can be done by removing a portion of thickness of silicon material 410 without removing any portion the BOX layer. In other embodiments, this process can be done by removing a portion of thickness of silicon material 310 without removing any portion of the EPI layer or without removing material from the CMOS IC device region.

In a specific embodiment, the thinning can include subjecting the ground surface region to a polishing process to smooth the ground surface region to a predetermined surface roughness, as shown in FIG. 4A. During either or both the grinding process and/or the polishing process, the thickness of the first substrate can be monitored. In a specific embodiment, the monitoring includes using an interferometer process to measure an indication associated with the thickness of the first semiconductor substrate. The interferometer process can use an electromagnetic radiation in an infrared wavelength range. In a specific embodiment, the polishing process can include a blanket etching process, as shown in FIG. 4A.

Also, the thinning can include cleaving a portion of the first semiconductor substrate at a cleave region to remove the desired thickness from the first substrate. The cleave region can be within a vicinity of the desired thickness, which is a remaining portion of the first substrate that is still attached to the CMOS IC device region. In another specific embodiment, the first substrate can be an SOI substrate including a bulk portion, overlying insulating layer, and single crystal device layer. The thinning can include selectively removing a portion of the SOI substrate from the single crystal device layer while maintaining attachment to the CMOS IC device region. In another specific embodiment, the thinning can include a patterned etching process such that one or more portions of the first semiconductor substrate within a vicinity of one or more CMOS IC devices are removed to form one or more second air dielectric regions 414, as shown in FIG. 4B. In a specific embodiment, the first substrate can be patterned before bonding. Air dielectric regions 414 can reduce metal line coupling, capacitance, signal interference, and other related issues. In a specific embodiment, regions 414 can also reduce parasitic coupling to the substrate, reduce signal loss, and reduce power while increasing bandwidth. These benefits, as well as others, can be used to achieve higher performance (i.e. less reflection and lower power) in antennas and lower loss and higher isolation in transmission lines. These benefits, as well as others, can be used to achieve higher performance (i.e. less reflection and lower power) in antennas and lower loss and higher isolation in transmission lines. Again, there can be other variations, modifications, and alternatives.

In an embodiment, one or more via structures can be formed within one or more portions of the desired thickness of the first semiconductor substrate. In a specific embodiment, one or more via structures can extend from one or more portions of the CMOS IC device region to a vicinity of the desired thickness of the first substrate. The one or more via structures 416 can be configured as one or more stop structures to form one or more end point regions of the thinning Additionally, a conformal coating of metal material can be formed within the one or more via structures. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 5A:
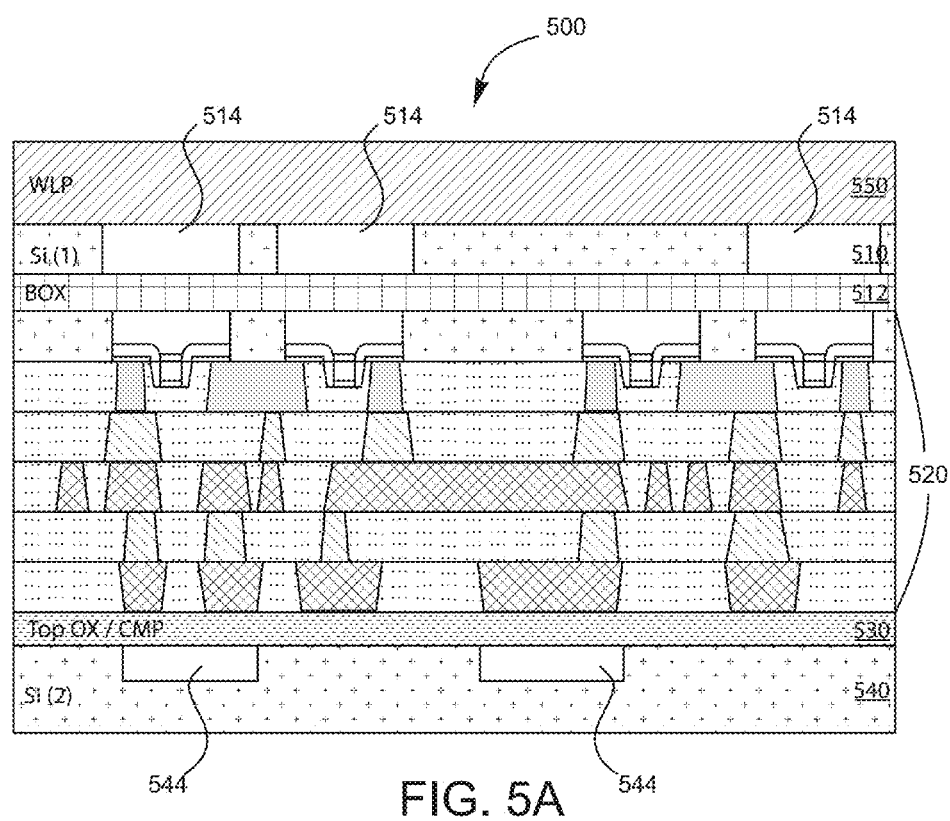
FIG. 5A is a simplified cross-section diagram of an integrated CMOS and MEMS device according to an embodiment of the present invention.
Figure 5B:
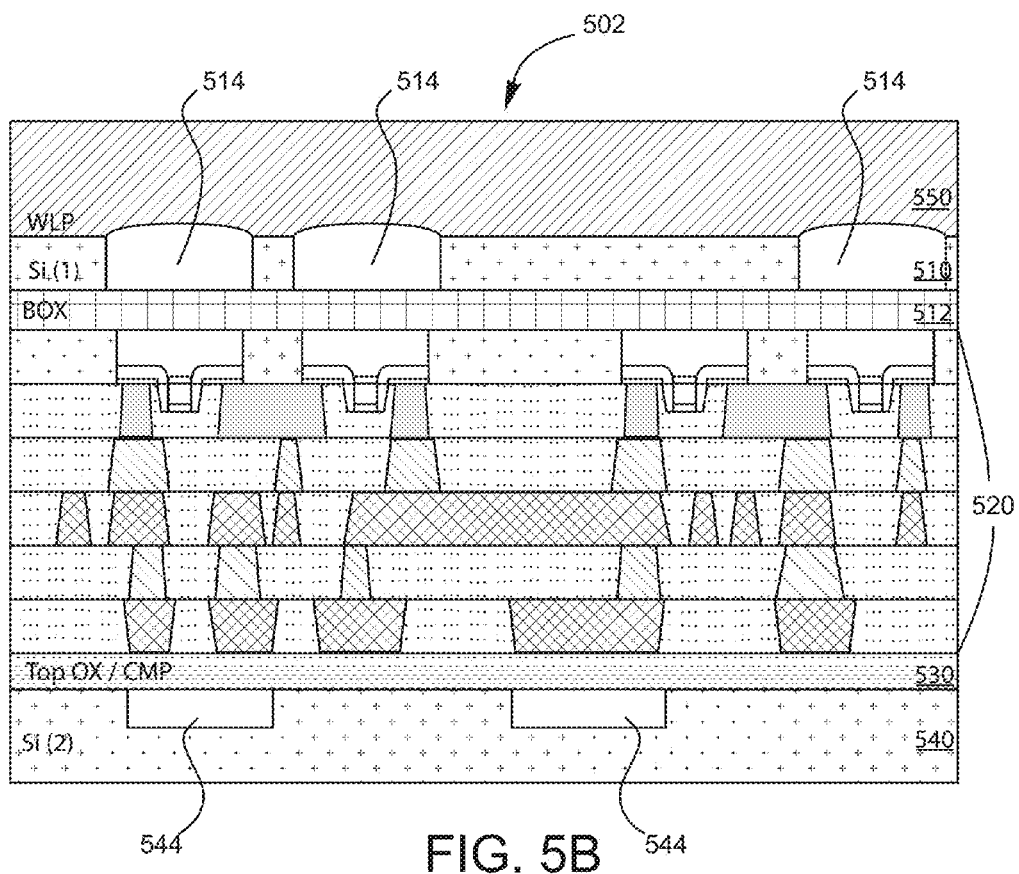
FIG. 5B is a simplified cross-section diagram of an integrated CMOS and MEMS device according to an embodiment of the present invention.
Figure 5C:
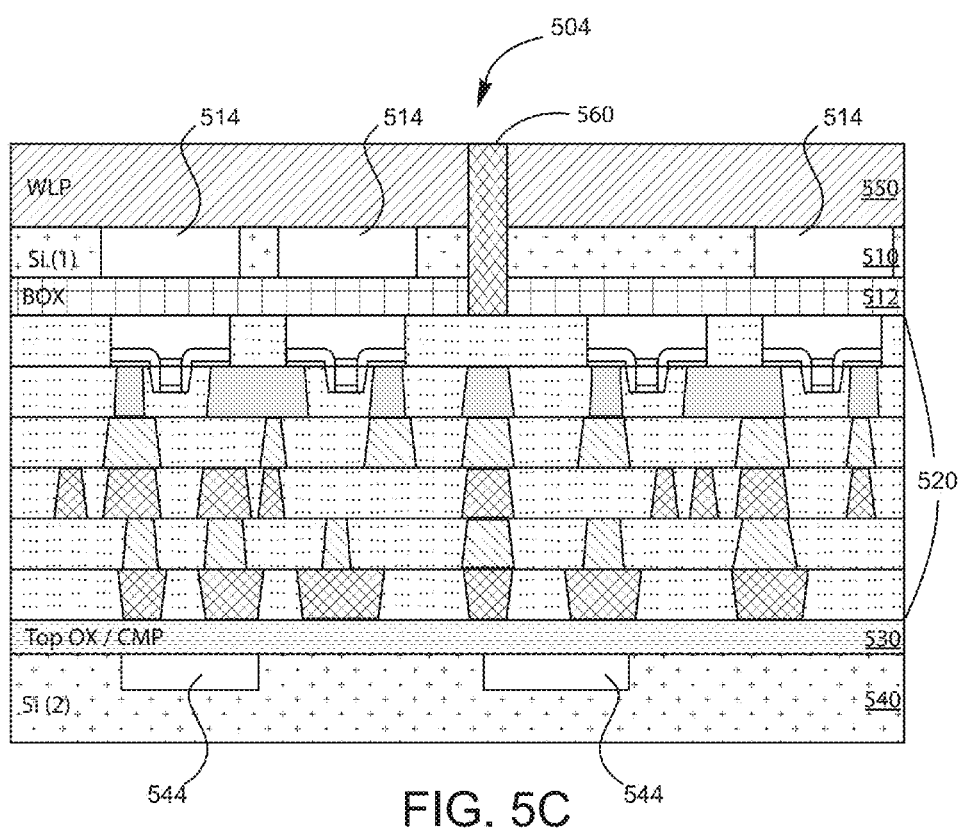
FIG. 5C is a simplified cross-section diagram of an integrated CMOS and MEMS device according to an embodiment of the present invention.

FIGS. 5A-5C are simplified cross-section diagrams of an integrated CMOS and MEMS device according to an embodiment of the present invention. This diagram is merely an example, which should not unduly limit the scope of the claims herein. One of ordinary skill in the art would recognize other variations, modifications, and alternatives. As shown, each of devices 500, 502, and 504 includes a thickness of silicon material 510, one or more CMOS integrated circuit (IC) devices 520, and a dielectric layer 530, a second semiconductor substrate 540, and an encapsulation layer 550. Components shown in these figures can represent a step in a method of fabricating an integrated CMOS and MEMS device using air dielectrics. Those of ordinary skill in the art will recognize other variations, modifications, and alternatives.

In an embodiment, thickness of silicon material 510 can be operably coupled to a BOX layer 512 to form a first semiconductor substrate. There can be different semiconductor substrate compositions and patterned etching processes can be applied to create one or more first air dielectric regions 514 within one or more portions of the first substrate and one or more second air dielectric regions 544 within one or more portions of the second substrate. Other variations, modifications, and alternatives regarding the first and second semiconductor substrate, the CMOS IC devices, dielectric layers and thinning processes have been discussed in the previous figures.

In an embodiment, encapsulation layer 550 can be spatially disposed overlying the first semiconductor substrate, which is shown in FIG. 5A overlying the CMOS IC devices 520, dielectric layer 530, and second semiconductor substrate 540. In a specific embodiment, encapsulation layer 550 can include a wafer layer protection layer (WLP layer), which can include a layer of material bonded to the first substrate. In another specific embodiment, the WLP layer can be a thin film of material deposited overlying the first substrate, as shown in FIG. 5B. Those skilled in the art will recognize other variations, modifications, and alternatives.

In an embodiment, one or more via structures 560 can be formed within one or more portions of the desired thickness of the first semiconductor substrate. In a specific embodiment, one or more via structures can extend from one or more portions of the CMOS IC device region to a vicinity of the desired thickness of the first substrate. One or more via structures 560 can be configured as one or more stop structures to form one or more end point regions of the thinning Additionally, a conformal coating of metal material can be formed within the one or more via structures 560. Via structures 560 can also extend through encapsulation layer 550. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

FIGS. 6A-6D are simplified cross-section diagrams of an integrated CMOS and MEMS device according to an embodiment of the present invention. This diagram is merely an example, which should not unduly limit the scope of the claims herein. One of ordinary skill in the art would recognize other variations, modifications, and alternatives. As shown, each of devices 600, 602, 604, and 606 includes a thickness of silicon material 610, one or more CMOS integrated circuit (IC) devices 620, and a dielectric layer 630, a second semiconductor substrate 640, an encapsulation layer 650, and one or more bonding structures. Components shown in these figures can represent a step in a method of fabricating an integrated CMOS and MEMS device using air dielectrics. Those of ordinary skill in the art will recognize other variations, modifications, and alternatives.

In an embodiment, thickness of silicon material 610 can be operably coupled to a BOX layer 612 to form a first semiconductor substrate. There can be different semiconductor substrate compositions and patterned etching processes can be applied to create one or more first air dielectric regions 614 within one or more portions of the first substrate and one or more second air dielectric regions 644 within one or more portions of the second substrate. Several types of WLP layers, such as wafer and thin film, can be applied depending on the type of application. Other variations, modifications, and alternatives regarding the first and second semiconductor substrate, the CMOS IC devices, dielectric layers and thinning processes have been discussed in the previous figures.

Figure 6A:
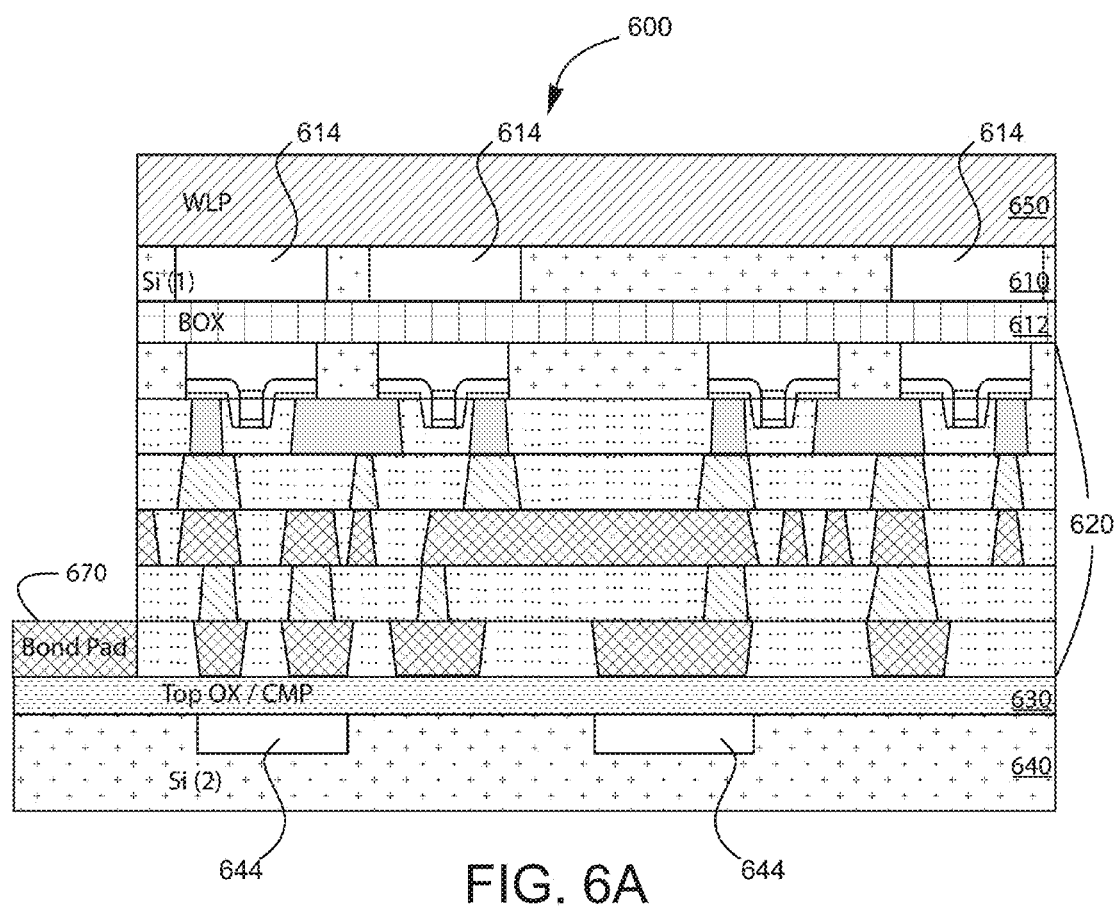
FIG. 6A is a simplified cross-section diagram of an integrated CMOS and MEMS device according to an embodiment of the present invention.
Figure 6B:
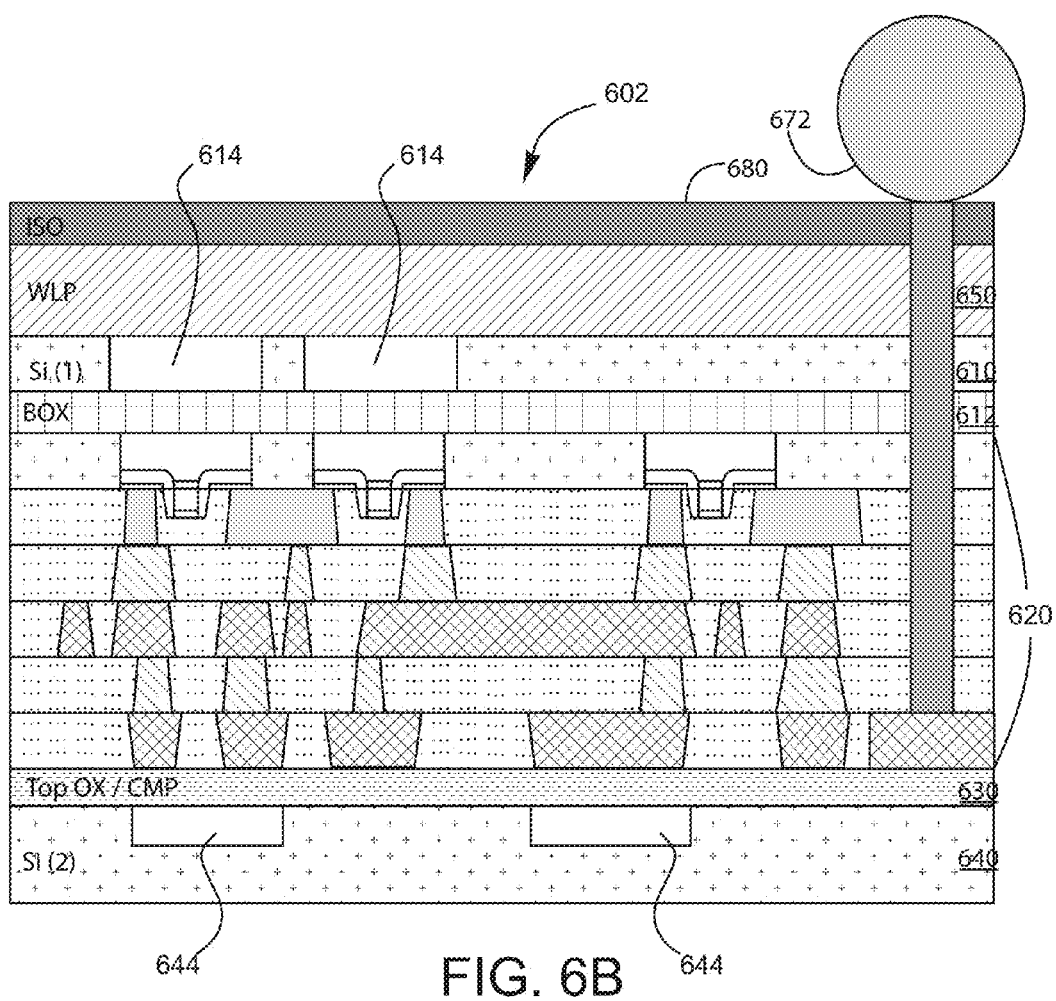
FIG. 6B is a simplified cross-section diagram of an integrated CMOS and MEMS device according to an embodiment of the present invention.
Figure 6C:
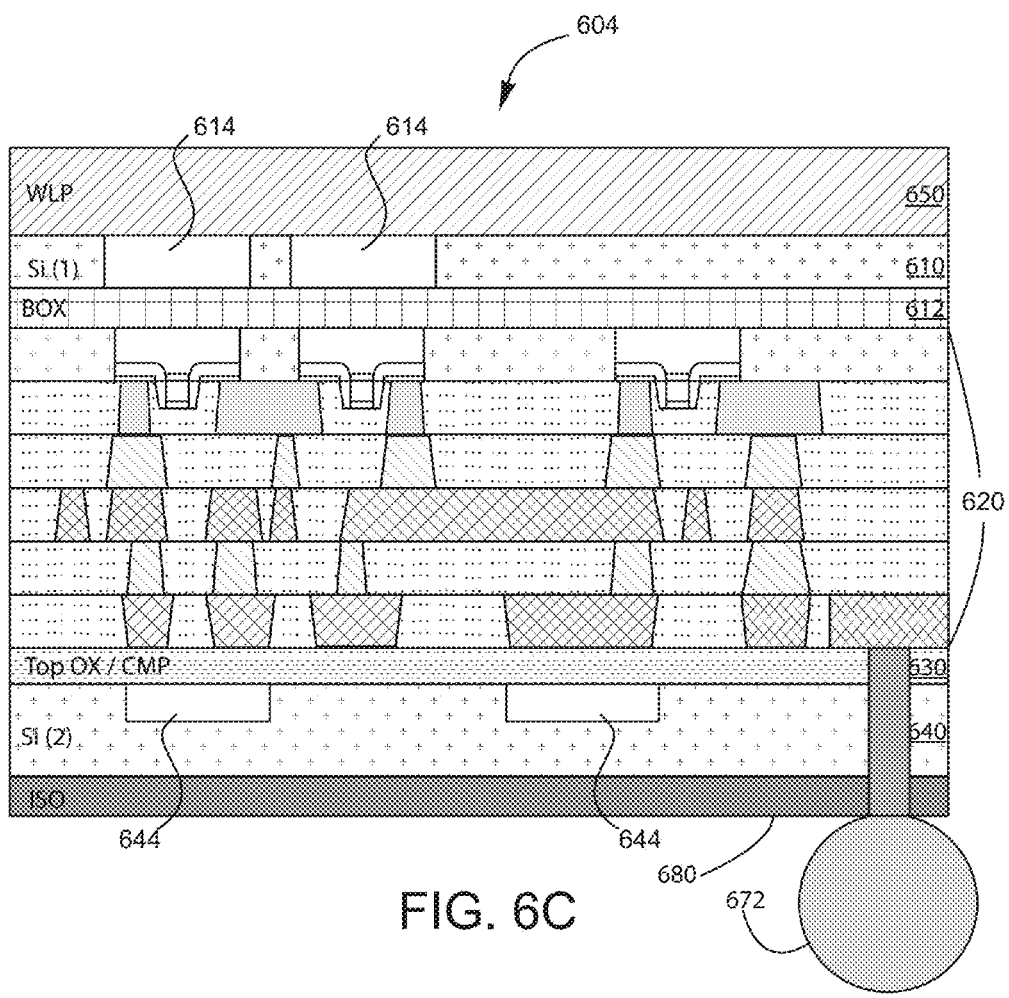
FIG. 6C is a simplified cross-section diagram of an integrated CMOS and MEMS device according to an embodiment of the present invention.
Figure 6D:
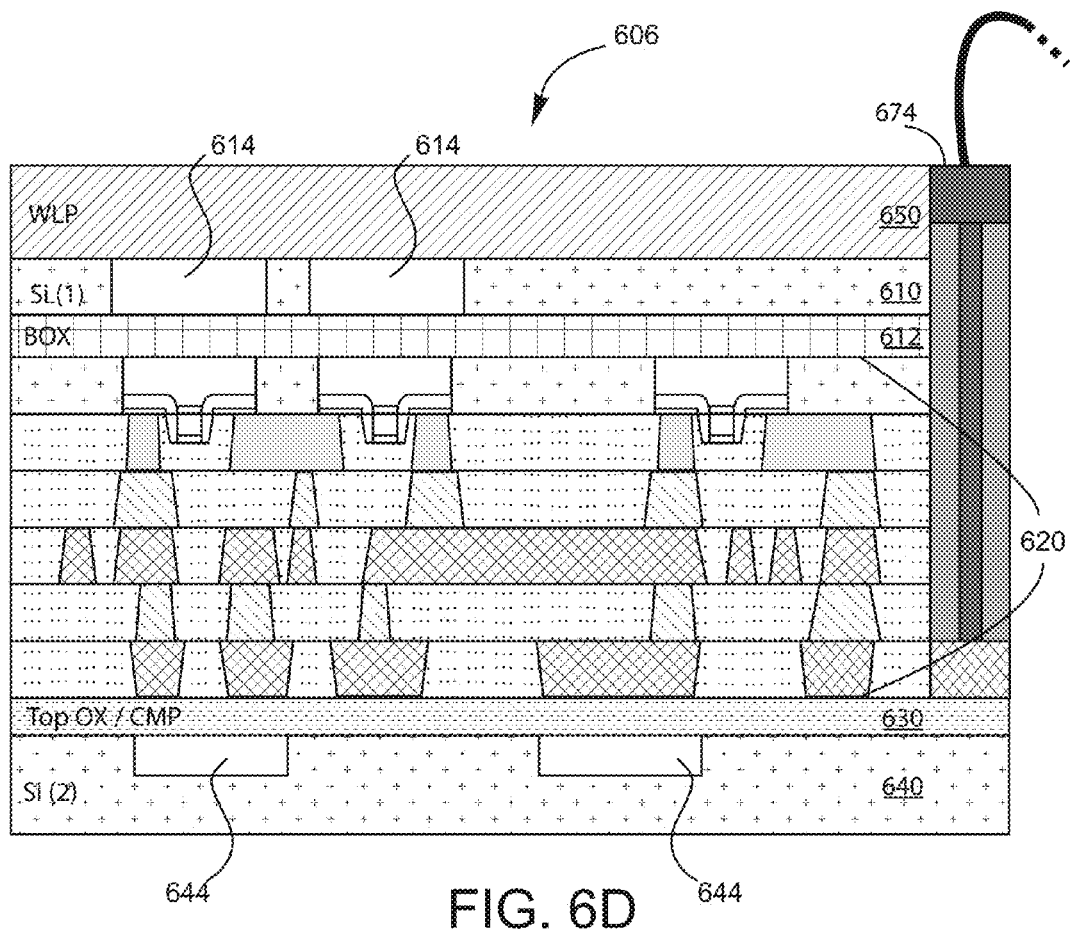
FIG. 6D is a simplified cross-section diagram of an integrated CMOS and MEMS device according to an embodiment of the present invention.
Figure 7A:
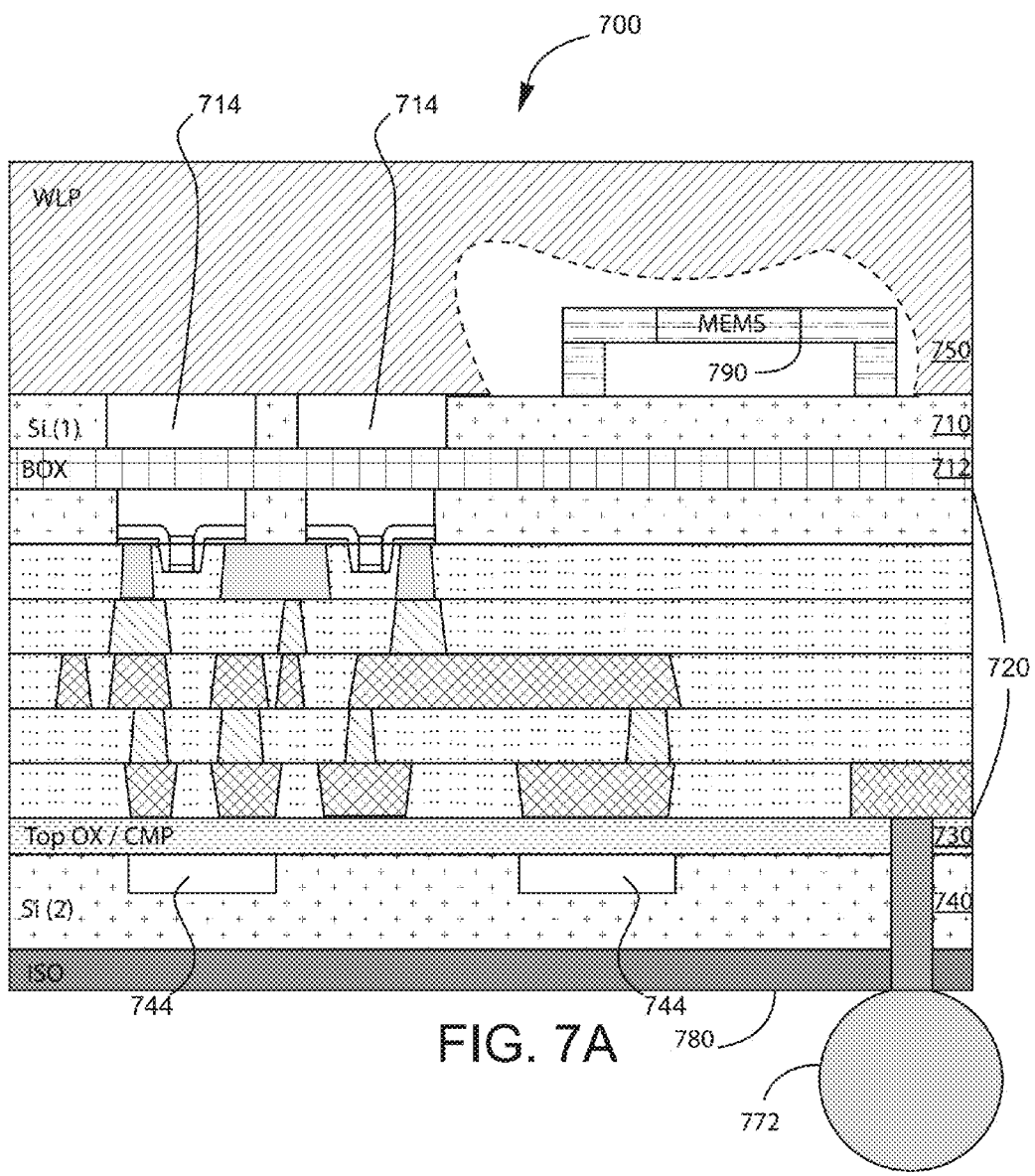
FIG. 7A is a simplified cross-section diagram of an integrated CMOS and MEMS device according to an embodiment of the present invention.
Figure 7B:
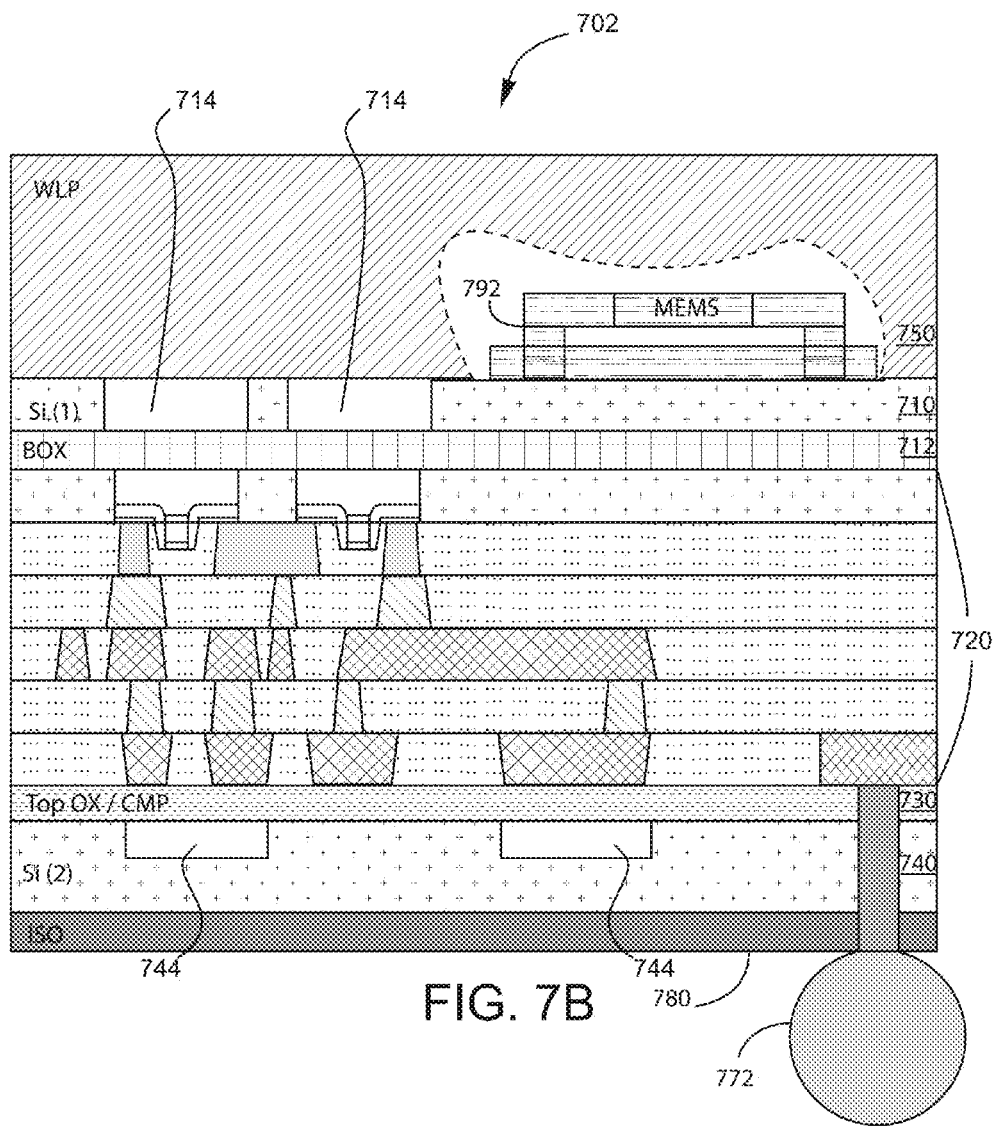
FIG. 7B is a simplified cross-section diagram of an integrated CMOS and MEMS device according to an embodiment of the present invention.
Figure 7C:
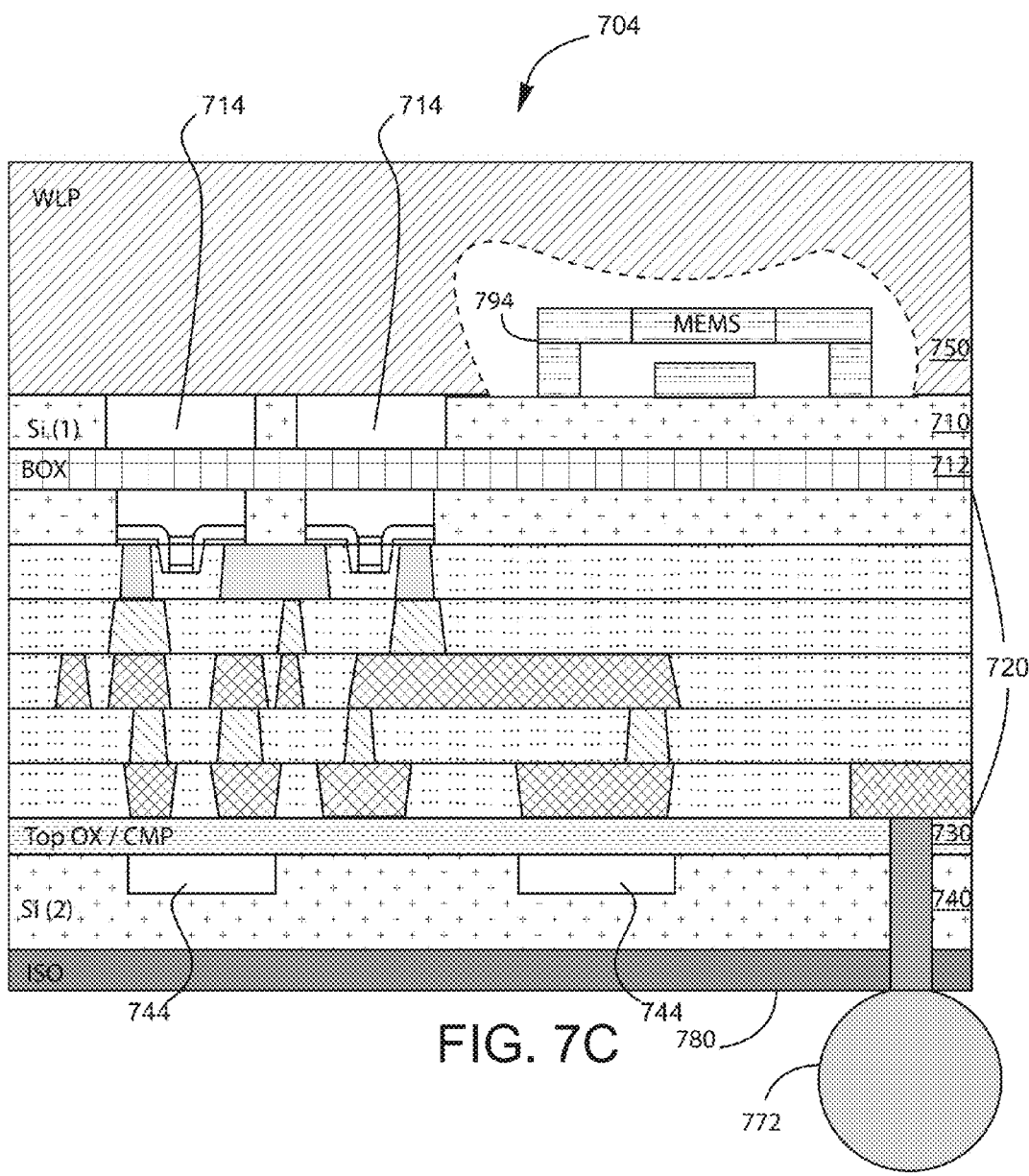
FIG. 7C is a simplified cross-section diagram of an integrated CMOS and MEMS device according to an embodiment of the present invention.
Figure 7D:
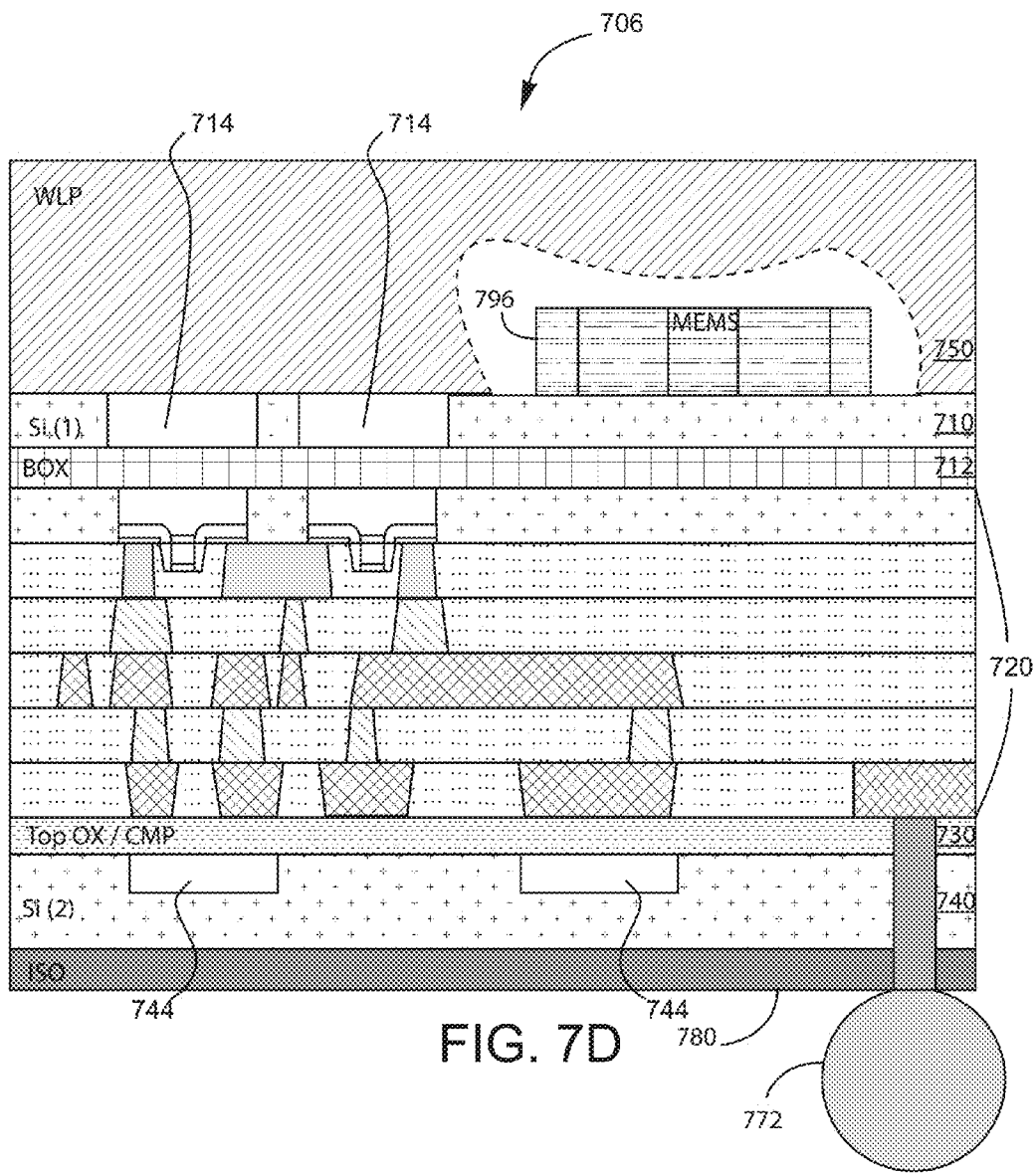
FIG. 7D is a simplified cross-section diagram of an integrated CMOS and MEMS device according to an embodiment of the present invention.

In an embodiment, one or more bonding structures can be operably coupled to each of devices 600, 602, 604, and 606. In a specific embodiment, a trench can be etched such that bonding pads 670 can be disposed on one or more portions of the top oxide layer, as shown in device 600 of FIG. 6A. In another specific embodiment, one or more bonding structures 672 can be operably coupled to device 602. Bonding structures 672 can have accessible regions overlying a portion of encapsulation layer 650, as shown in FIG. 6B. In another embodiment, one or more bonding structures 672 can be operably coupled to device 604. Bonding structures 672 can have accessible regions within one or more portions of the second semiconductor substrate, as shown in FIG. 6C. In the cases of FIGS. 6B and 6C, an isolation layer 680 is needed to separate the accessible regions of bonding structures 670 from the other device layers. In yet another embodiment, one or more bonding structures 674 can be operably coupled to device 606. Bonding structures 674 can have accessible regions within one or more portions of encapsulation layer 650. Each of bonding structures 672 and 674 can have a bonding pad, a via structure, and a pad structure, but can have other structures as well. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

FIGS. 7A-7D are simplified cross-section diagrams of an integrated CMOS and MEMS device according to an embodiment of the present invention. This diagram is merely an example, which should not unduly limit the scope of the claims herein. One of ordinary skill in the art would recognize other variations, modifications, and alternatives. As shown, each of devices 700, 702, 704, and 706 includes a thickness of silicon material 710, one or more CMOS integrated circuit (IC) devices 720, and a dielectric layer 730, a second semiconductor substrate 740, an encapsulation layer 750, one or more bonding structures, and one or more free standing MEMS structures. Components shown in these figures can represent a step in a method of fabricating an integrated CMOS and MEMS device using air dielectrics. Those of ordinary skill in the art will recognize other variations, modifications, and alternatives.

In an embodiment, the thickness of silicon material can be operably coupled to a BOX layer 712 to form a first semiconductor substrate. There can be different semiconductor substrate compositions and patterned etching processes can be applied to create one or more first air dielectric regions 714 within one or more portions of the first substrate and one or more second air dielectric regions 744 within one or more portions of the second substrate. Several types of encapsulation layers, such as wafer and thin film, can be applied depending on the type of application. Also, several types of bonding structures including bonding pads, via structures, and pad structures can and operably coupled to the integrated device to provide accessible connection points. Other variations, modifications, and alternatives regarding the first and second semiconductor substrate, the CMOS IC devices, dielectric layers and thinning processes have been discussed in the previous figures.

In an embodiment, one or more free standing MEMS structures can be formed within one or more portions of the desired thickness of the first semiconductor substrate. One or more MEMS structures can be configured to be supported by one or more members integrally formed on the desired thickness of the first semiconductor substrate. Each of devices 700, 702, 704, and 706 shows a specific type of MEMS device that can be formed within the first substrate. The MEMS structures can include a varactor 790, a switch 792, an inductor 794, a filter 796, and others. The MEMS structures can also include inertial sensors, pressure sensors, timing devices, and rf devices, but can be others as well. There can be other variations, modifications, and alternatives.

In a specific embodiment, a sacrificial layer can be formed overlying the one or more free standing MEMS structures. An enclosure layer can then be formed overlying the sacrificial layer. The enclosure layer can have one or more openings to expose one or more portions of the sacrificial layer. In a specific embodiment, the enclosure layer can include a titanium material, which can be activated as a getter layer. In other embodiments, the enclosure layer can include a material selected from a metal, a semiconductor material, and amorphous silicon material, a dielectric layer, or a combination of these layers, and other materials as well. Of course, there can be other variations, modifications, and alternatives.

In an embodiment, the sacrificial layer can be removed via an ashing process to form an open region between the one or more free standing MEMS structures and the enclosure layer. Also, an encapsulating layer can be formed overlying the enclosure layer to substantially seal the one or more free standing MEMS structures to form a predetermined environment within the open region. In a specific embodiment, the predetermined environment can include an inert gaseous environment at a determined pressure. Also, the encapsulating layer can be selected from a metal layer, a spin on glass, a spray on glass, amorphous silicon, a dielectric layer, or any combination of these layers. In an embodiment, the enclosure layer can be configured overlying a first outer region of the desired thickness of the first substrate. The enclosure can have an upper cover region. One or more bonding structures 772 can be formed within a vicinity of the upper cover region and provided within a second outer region of the thickness of the first substrate. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 8:
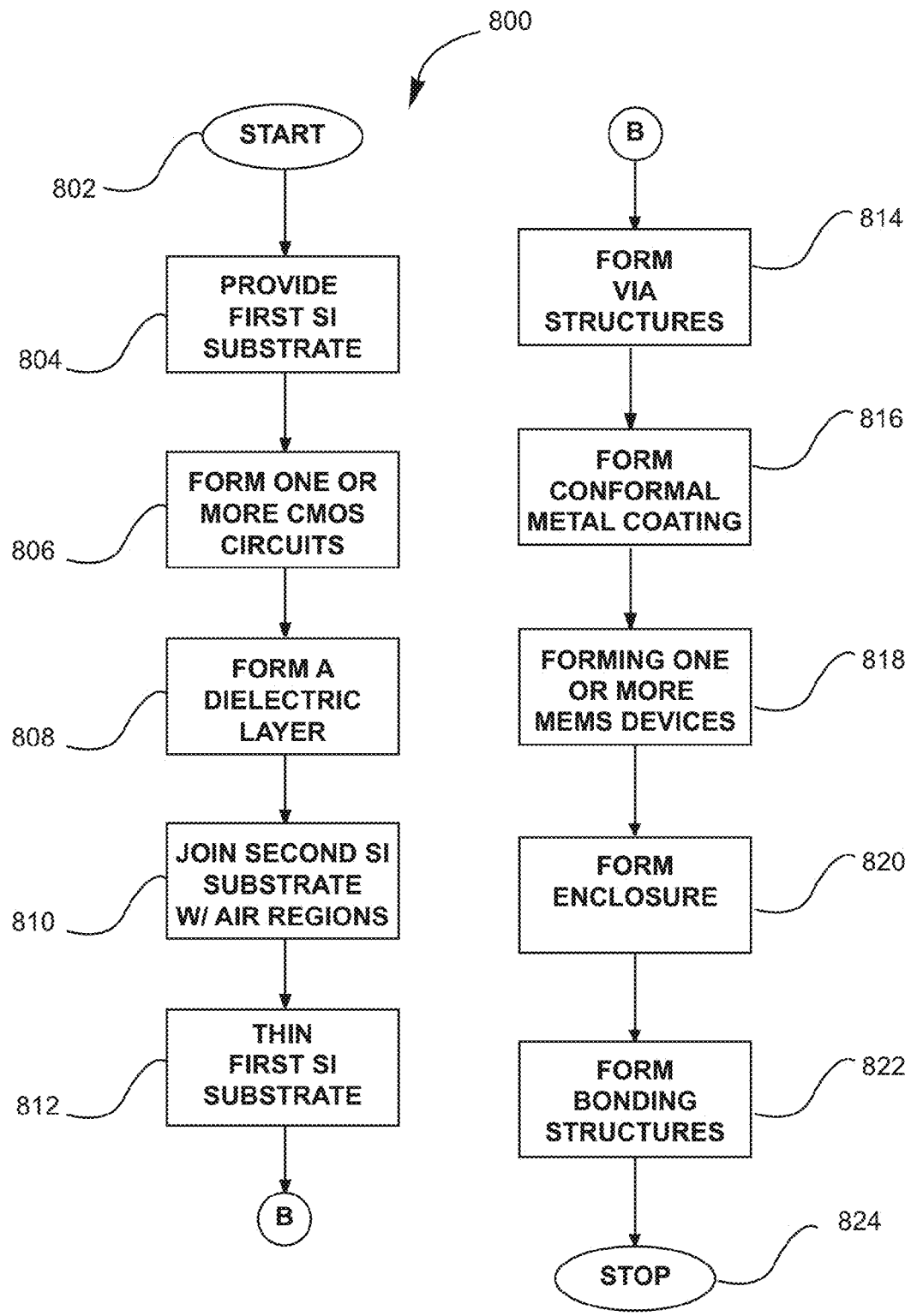
FIG. 8 is a simplified flow diagram of an integrated CMOS and MEMS device fabrication method according to an embodiment of the present invention.

FIG. 8 is a simplified flow diagram illustrating a method of fabricating an integrated CMOS and MEMS device using air dielectrics according to an embodiment of the present invention. This diagram is merely an example, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 8, the present method can be briefly outlined below.

1. Start;
2. Provide a first semiconductor substrate;
3. Form one or more CMOS circuits overlying the first substrate;
4. Form a dielectric layer overlying the CMOS circuits;
5. Join a second semiconductor substrate with air dielectric to the dielectric layer;
6. Thin the first semiconductor substrate;
7. Form one or more via structures;
8. Form a conformal metal coating within the via structures;
9. Form one or more MEMS devices;

10. Form an enclosure housing the MEMS devices;
11. Form bonding structures; and
12. Stop.

These steps are merely examples and should not unduly limit the scope of the claims herein. As shown, the above method provides a way of fabricating an integrated CMOS and MEMS device using air dielectrics according to an embodiment of the present invention. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 8, method 800 begins at start, step 802. The present method provides a fabrication method for forming an integrated CMOS and MEMS device using air dielectrics. Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. The invention provides for an improved integrated MEMS and CMOS circuit device and related methods for a variety of uses. Depending upon the embodiment, one or more of these benefits may be achieved. These and other benefits will be described in more throughout the present specification and more particularly below.

Following step 802, fabrication method 800 involves providing a first semiconductor substrate having a first surface region, step 804. In an embodiment, a layer of material can be spatially disposed overlying the thickness of silicon material to form a first semiconductor substrate. In a specific embodiment, the layer of material disposed overlying the thickness of silicon material can be a buried oxide (BOX) layer. In another specific embodiment, the layer of material disposed overlying the thickness of silicon material can be an epitaxial (EPI) layer or the first semiconductor substrate can have just the thickness of silicon material. In further embodiments, the first and second semiconductor substrate can have a silicon, single crystal silicon, or polycrystalline silicon material. Those skilled in the art will recognize other variations, modifications, and alternatives.

In an embodiment, the first semiconductor substrate can have a first surface region and a CMOS device region can be a region overlying the first surface region. One or more CMOS IC devices can be formed on the CMOS IC device region overlying the first surface region, step 806. The CMOS IC device region can have a CMOS surface region. In a specific embodiment, the one or more CMOS IC devices can include transistor devices, metal layers, via structures, and others. In further embodiments, additional transistors, metal layers, and structures can be added. The fabrication of the one or more CMOS IC devices can be done through foundry-compatible processes. Of course, there can be other variations, modifications, and alternatives.

Following the formation of CMOS IC devices, a dielectric layer can be formed overlying the CMOS surface region, step 808. The dielectric layer can have one or more patterned regions. In a specific embodiment, the dielectric layer can be a top oxide layer or formed via a chemical mechanical planarization (CMP) process. As stated previously, there can be other variations, modifications, and alternatives.

After the dielectric layer is formed, a second semiconductor substrate can be joined to the CMOS surface region by bonding the second surface region to the dielectric layer, step 810. The second semiconductor substrate can have a second surface region. Also, the second semiconductor substrate can be patterned such that one or more portions of the second substrate within a vicinity of the one or more CMOS IC devices are removed in order to form one or more first air dielectric regions. Again, there can be other variations, modifications, and alternatives.

After joining the second substrate, the first substrate can be thinned to a desired thickness while maintaining attachment to the CMOS IC device region, step 812. In a specific embodiment, the thinning can include a grinding process to remove a thickness of material from the first semiconductor substrate to expose a ground surface region. This process can be done by removing a portion of the thickness of silicon material without removing any portion the BOX layer. In other embodiments, this process can be done by removing a portion of the thickness of silicon material without removing any portion of the EPI layer or without removing material from the CMOS IC device region.

In a specific embodiment, the thinning can include subjecting the ground surface region to a polishing process to smooth the ground surface region to a predetermined surface roughness. During either or both the grinding process and/or the polishing process, the thickness of the first substrate can be monitored. In a specific embodiment, the monitoring includes using an interferometer process to measure an indication associated with the thickness of the first semiconductor substrate. The interferometer process can use an electromagnetic radiation in an infrared wavelength range. In a specific embodiment, the polishing process can include a blanket etching process.

Also, the thinning can include cleaving a portion of the first semiconductor substrate at a cleave region to remove the desired thickness from the first substrate. The cleave region can be within a vicinity of the desired thickness, which is a remaining portion of the first substrate that is still attached to the CMOS IC device region. In another specific embodiment, the first substrate can be an SOI substrate including a bulk portion, overlying insulating layer, and single crystal device layer. The thinning can include selectively removing a portion of the SOI substrate from the single crystal device layer while maintaining attachment to the CMOS IC device region. In another specific embodiment, the thinning can include a patterned etching process such that one or more portions of the first semiconductor substrate within a vicinity of one or more CMOS IC devices are removed to form one or more second air dielectric regions. Again, there can be other variations, modifications, and alternatives.

After the desired thickness of the first substrate remains, one or more via structures can be formed within one or more portions of the desired thickness of the first substrate, step 814. In a specific embodiment, one or more via structures can extend from one or more portions of the CMOS IC device region to a vicinity of the desired thickness of the first substrate. The one or more via structures can be configured as one or more stop structures to form one or more end point regions of the thinning Additionally, a conformal coating of metal material can be formed within the one or more via structures, step 816. Of course, there can be other variations, modifications, and alternatives.

Following the formation of the metal coating, one or more free standing MEMS structures can be formed within one or more portions of the desired thickness of the first semiconductor substrate, step 818. One or more MEMS structures can be configured to be supported by one or more members integrally formed on the desired thickness of the first semiconductor substrate. The MEMS structures can include a varactor, a switch, an inductor, a filter, and others. The MEMS structures can also include inertial sensors, pressure sensors, timing devices, and rf devices, but can be others as well. There can be other variations, modifications, and alternatives.

After the MEMS device are formed, an enclosure layer can be formed overlying the first semiconductor substrate, step 820. In a specific embodiment, the enclosure layer can be a WLP layer, which can include a layer of material bonded to the first substrate. In another specific embodiment, the WLP layer can be a thin film of material deposited overlying the first substrate. Those skilled in the art will recognize other variations, modifications, and alternatives.

In an embodiment, one or more bonding structures can be formed within one or more portions of the integrated device. In a specific embodiment, a trench can be etched such that the bonding pads can be disposed on one or more portions of the top oxide layer. In another specific embodiment, the one or more bonding structures can be operably coupled to the integrated device. The bonding structures can have accessible regions overlying a portion of the enclosure layer. In another embodiment, the one or more bonding structures can be operably coupled to the integrated device. The bonding structures can have accessible regions within one or more portions of the second semiconductor substrate. In these cases with accessible regions, an isolation layer is needed to separate the accessible regions of the bonding structures from the other device layers. In yet another embodiment, the one or more bonding structures can be operably coupled to the integrated device. The bonding structures can have accessible regions within one or more portions of the enclosure layer. Each of the bonding structures can have a bonding pad, a via structure, and a pad structure, but can have other structures as well. Of course, there can be other variations, modifications, and alternatives.

The above sequence of processes provides a fabrication method for forming an integrated CMOS and MEMS device according to an embodiment of the present invention. As shown, the method uses a combination of steps including providing a first substrate, forming CMOS devices, forming a dielectric layer, joining a second substrate with patterned air dielectric regions to the dielectric layer, thinning the first substrate, forming via structures, forming a conformal metal coating within the via structures, and forming one or more free standing MEMS structures, and forming an enclosure. Other alternatives can also be provided where steps are added, one or more steps are removed, or one or more steps are provided in a different sequence without departing from the scope of the claims herein. Further details of the present method can be found throughout the present specification.

What is claimed is:

1. A monolithic integrated CMOS and MEMS device, the device comprising:
   a thickness of a first semiconductor substrate having a first top surface region and a first bottom surface region;
   one or more CMOS integrated circuit (IC) devices provided on a CMOS integrated circuit (IC) device region coupled to the first bottom surface region, the CMOS IC device region having a CMOS surface region, wherein the one or more CMOS IC devices includes a plurality of transistors configured in an upside-down orientation;
   a bonding material coupled to the CMOS surface region;
   a second semiconductor substrate having a second top surface region and a second bottom surface region, the second top surface region coupled to the CMOS surface region by bonding the second top surface region to the bonding material, the second semiconductor substrate comprising one or more first air dielectric regions spatially configured towards the second top surface region;
   one or more free standing MEMS structures overlying and adjacent to one or more portions of the first top surface region of the thickness of the first semiconductor substrate.

2. The device of claim 1 wherein the first semiconductor substrate is selected from a group consisting of: a buried oxide (BOX) layer overlying a silicon substrate, an epitaxial (EPI) layer overlying a silicon substrate, an amorphous silicon substrate, a single crystal silicon substrate, and a polycrystalline silicon substrate.

3. The device of claim 1 wherein each of the plurality of transistors has source and drain regions above a gate region, and the one or more free standing MEMS structures are disposed closer to the source and drain regions than to the gate region.

4. The device of claim 1 further comprising one or more via structures within one or more portions of the first semiconductor substrate, the one or more via structures extending from one or more portions of the CMOS integrated circuit device region to a vicinity of the thickness of the first semiconductor substrate.

5. The device of claim 1 further comprising an enclosure layer overlying the one or more free standing MEMS devices, the enclosure layer having one or more openings.

6. The device of claim 5 wherein the enclosure layer comprises a titanium material, the titanium material being activated as a getter layer.

7. The device of claim 5 further comprising:
   an open region provided between the one or more free standing MEMS structures and the enclosure layer; and
   an encapsulating layer provided overlying the enclosure layer to substantially seal the one or more free standing MEMS structures to form a predetermined environment within the open region.

8. The device of claim 7 wherein the predetermine environment comprises an inert gas at a determined pressure.

9. The device of claim 1 further comprising one or more bond pad openings to expose one or more bond pads coupled to the CMOS device layer.

10. The device of claim 1 further comprising an enclosure housing the one or more free standing MEMS structures, the enclosure configured overlying the first outer region of the thickness of the first semiconductor substrate, the enclosure having an upper cover region.

11. A monolithic integrated CMOS and MEMS device, the device comprising:
    a thickness of a first semiconductor substrate having a first top surface region, a first bottom surface region, and one or more first air dielectric regions;
    one or more CMOS integrated circuit (IC) devices provided on a CMOS integrated circuit (IC) device region coupled to the first bottom surface region, the CMOS IC device region having a CMOS surface region, wherein the one or more CMOS IC devices includes a plurality of transistors configured in a flipped orientation;
    a bonding material coupled to the CMOS surface region;
    a second semiconductor substrate having a second top surface region and a second bottom surface region, the second top surface region coupled to the CMOS surface region by bonding the second top surface region to the bonding material, the second semiconductor substrate comprising one or more second air dielectric regions spatially configured towards the second top surface region;

one or more free standing MEMS structures overlying one or more portions of the first top surface region of the thickness of the first semiconductor substrate.

12. The device of claim 11 wherein the first semiconductor substrate is selected from a group consisting of: a buried oxide (BOX) layer overlying a silicon substrate, an epitaxial (EPI) layer overlying a silicon substrate.

13. The device of claim 11 wherein the bonding material is a chemical mechanical planarization (CMP) processed bonding material or a top oxide material.

14. The device of claim 11 further comprising an enclosure layer overlying the one or more free standing MEMS devices, the enclosure layer having one or more openings, wherein the enclosure layer comprises a titanium material, the titanium material being activated as a getter layer.

15. The device of claim 14 further comprising:
an open region provided between the one or more free standing MEMS structures and the enclosure layer; and
an encapsulating layer provided overlying the enclosure layer to substantially seal the one or more free standing MEMS structures to form a predetermined environment within the open region, wherein the predetermined environment comprises an inert gas at a determined pressure.

16. The device of claim 15 wherein the encapsulating layer is selected from a metal layer, a spin on glass, a spray on glass, amorphous silicon, a dielectric layer, or any combination of these layers.

17. A monolithic integrated CMOS and MEMS device, the device comprising:
a thickness of a first semiconductor substrate having a first top surface region and a first bottom surface region;
one or more CMOS integrated circuit (IC) devices provided on a CMOS integrated circuit (IC) device region coupled to the first bottom surface region, the CMOS IC device region having a CMOS surface region, wherein the one or more CMOS IC devices includes a plurality of transistors configured in an upside-down orientation and a plurality of interconnect layers below the plurality of transistors;
a bonding material coupled to the CMOS surface region;
a second semiconductor substrate having a second top surface region and a second bottom surface region, the second top surface region coupled to the CMOS surface region by bonding the second top surface region to the bonding material, the second semiconductor substrate comprising one or more first air dielectric regions spatially configured towards the second top surface region;
a bonding structure coupled to a top interconnect layer in the CMOS IC device region at the CMOS surface region;
one or more free standing MEMS structures overlying and adjacent to one or more portions of the first top surface region of the thickness of the first semiconductor substrate.

18. The device of claim 17 wherein the first semiconductor substrate is a buried oxide (BOX) layer overlying a silicon substrate or an epitaxial (EPI) layer overlying a silicon substrate.

19. The device of claim 17 wherein the bonding structure comprises a portion extending through the second semiconductor substrate.

20. The device of claim 17 wherein the bonding structure comprises a portion extending through the first semiconductor substrate.

* * * * *